United States Patent
Ishizaki

(10) Patent No.: US 6,982,438 B2
(45) Date of Patent: Jan. 3, 2006

(54) LIGHT EMITTING DEVICE AND METHOD FOR FABRICATING THE SAME

(75) Inventor: Jun-ya Ishizaki, Annaka (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 0 days.

(21) Appl. No.: 10/484,408

(22) PCT Filed: Jul. 24, 2002

(86) PCT No.: PCT/JP02/07471

§ 371 (c)(1),
(2), (4) Date: Jan. 21, 2004

(87) PCT Pub. No.: WO03/030273

PCT Pub. Date: Apr. 10, 2003

(65) Prior Publication Data

US 2004/0235212 A1    Nov. 25, 2004

(30) Foreign Application Priority Data

Jul. 25, 2001 (JP) ............... 2001-225139
Oct. 3, 2001 (JP) ............... 2001-307324

(51) Int. Cl.
*H01L 33/00* (2006.01)

(52) U.S. Cl. ............ 257/103; 257/81; 257/96; 257/432

(58) Field of Classification Search ......... 257/79–103
See application file for complete search history.

(56) References Cited

U.S. PATENT DOCUMENTS

| 5,959,307 A | 9/1999 | Nakamura et al. |
| 6,222,868 B1 | 4/2001 | Ouchi et al. |
| 6,674,098 B1 * | 1/2004 | Niki et al. ............ 257/102 |

FOREIGN PATENT DOCUMENTS

| EP | 0 772 249 A2 | 5/1997 |
| EP | 1 115 163 A1 | 7/2001 |
| JP | 9-92930 | 4/1997 |
| JP | 10-126006 | 5/1998 |
| JP | 10-242512 | 9/1998 |

(Continued)

Primary Examiner—Long Pham
Assistant Examiner—Wai-Sing Louie
(74) Attorney, Agent, or Firm—Snider & Associates; Ronald R. Snider

(57) ABSTRACT

In a MgZnO layer composing an active layer or a p-type cladding layer 32, a p-type oxide layer 32b which is different from $Mg_aZn_{1-a}O$-type oxide and has a p-type conductivity is disposed. Because a function of absorbing and compensating electrons in this configuration is owned by the p-type oxide layer localized in the MgZnO layer, it is no more necessary to add a large amount of dopant, and this is successful in obtaining a p-type or i-type $Mg_aZn_{1-a}O$-type oxide having a desirable quality, and in realizing a high-emission-efficiency, light-emitting device capable of emitting ultraviolet or blue light. Adoption of a junction structure, in which at least either of the p-type cladding layer and the n-type cladding layer comprises a first crystal layer, and a second crystal layer which is hetero-bonded to the first crystal layer, and on the side thereof opposite to the active layer and has a band gap energy smaller than that of the first crystal layer, is successful in effectively injecting the carrier to the active layer, and consequently in raising the emission efficiency.

23 Claims, 13 Drawing Sheets

FOREIGN PATENT DOCUMENTS

| | | |
|---|---|---|
| JP | 11-168262 | 6/1999 |
| JP | 11-243251 | 9/1999 |
| JP | 2001-44499 | 2/2001 |
| JP | 2001-44500 | 2/2001 |
| JP | 2001-68707 | 3/2001 |
| JP | 2001-237460 | 8/2001 |
| JP | 2002-170993 | 6/2002 |
| JP | 2002-289918 | 10/2002 |
| WO | WO 00/16411 A1 | 3/2000 |
| WO | WO 01/08229 A1 | 2/2001 |

* cited by examiner

○ : OXYGEN
● : ZINC OR MAGNESIUM

LIGHT EMITTING DEVICE AND METHOD FOR FABRICATING THE SAME

TECHNICAL FIELD

This invention relates to a method of fabricating a light-emitting device using semiconductor, and in particular to a light-emitting device suitable for blue-light or ultraviolet emission.

BACKGROUND ART

There has long been a need for a light-emitting device using a semiconductor of wide-gap type, having a band gap energy of 2.2 eV or larger, and in particular for a high-luminance, light-emitting device capable of emitting short-wavelength light in blue light region. This sort of light-emitting device has recently been realized using a wide-gap-type, gallium-nitride-base material, which is exemplified by AlGaInN-base material, of which band gap energy at room temperature is variable from 2.0 eV to 6.2 eV. Also a rapid progress has been made in applying it to full-color, light-emitting device or display by combining it with red to green high-luminance, light-emitting devices.

However, the AlGaInN-base material, mainly composed of rare metals such as Ga and In, inevitably raises the cost. Another serious problem resides in that the growth temperature of this material is as high as 700 to 1,000° C., and thus consumes a considerably large amount of energy for the manufacture. This is undesirable not only from the viewpoint of cost reduction, but also in view of that this is against the trends of the time having a lot of argument on energy saving and suppression of the global warming. Considering the situation, there are proposed light-emitting devices in which the light-emitting layer portion thereof is composed of a material other than gallium nitride, that is, less expensive zinc oxide (ZnO), magnesium oxide (MgO), or zinc magnesium oxide ($Mg_xZn_{1-x}O$ ($0<x\leq1$), simply referred to as MgZnO, hereinafter and X of this composition formula is defined as alloy composition.) which is an alloy of the both.

Zinc magnesium oxide is a typical wide-gap-type oxide having a band gap energy at room temperature of 3.25 eV to 4.02 eV, and has already been investigated for use in high-efficiency, light-emitting devices such as short-wavelength semiconductor laser, high-luminance blue LED, and ultraviolet light-emitting device. For example, Japanese Laid-Open Patent Publication No. 2001-44500 discloses a light-emitting device having a ZnO-base compound semiconductor layer grown on a sapphire substrate by hetero epitaxy. Japanese Laid-Open Patent Publication No. 11-168262 discloses a two-dimensional-array surface emission laser device using the above-described ZnO-base compound semiconductor light-emitting device.

Japanese Laid-Open Patent Publication No. 2001-44500 exemplifies the MBE (molecular beam epitaxy) process and the MOVPE (metal-organic vapor phase epitaxy) process as methods for growing the ZnO-base compound semiconductor layer. The MBE process, however, suffers from a problem in that a low pressure of the growth environment makes it difficult to suppress generation of oxygen deficiency, and this also makes it difficult to form a p-type or intrinsic (also referred to as "i-type" taking a first letter of "intrinsic") ZnO-base oxide layer which is indispensable for composing the light-emitting device. It is also difficult to apply the MBE process, which inevitably depends on the use of ultraviolet laser, to crystal growth over a wide area, because the laser can ensure a desirable quality of crystal only in an irradiated area, and this makes the process difficult to be applied to industrial application. On the other hand, the MOVPE process, which does not rely upon ultraviolet laser and instead conveys source materials in a vapor phase, is advantageous in that it can more readily be applied to the large-area growth, but formation of the p-type or i-type oxide layer using a ZnO-base oxide is practically unrealized on the industrial basis because of generation of oxygen deficiency.

For the case where the light-emitting device is configured using MgZnO, it is effective to adopt a double hetero-structure in which an active layer is sandwiched between p-type and n-type cladding layers, similarly to as other hetero-junction-type, light-emitting devices. The $Mg_xZn_{1-x}O$ alloy will have a larger band gap energy as the alloy composition x increases, so that reduction of the alloy composition x in the active layer and increase of the alloy composition x in the cladding layers is effective in terms of enhancing the emission efficiency based on carrier confinement within the active layer.

It is to be noted that ZnO is an n-type semiconductor in its non-doped status, and MgO is an insulator, so that the $Mg_xZn_{1-x}O$ alloy has a larger insulating property as the alloy composition x increases. Adoption of $Mg_xZn_{1-x}O$ having a large alloy composition x for the cladding layer therefore makes it difficult to raise the effective carrier concentration of the cladding layer by doping, so that it is necessary to suppress the alloy composition x of the $Mg_xZn_{1-x}O$ alloy composing the cladding layer to some degree in order to achieve a desired carrier concentration. Suppression of the alloy composition x in the cladding layer, however, reduces the band gap energy thereof. This undesirably suppresses confinement effect exerted on the carriers injected to the active layer, and consequently makes it unable to fabricate a high-luminance, light-emitting device.

It is therefore a first subject of this invention to provide a light-emitting device having exactly formed therein a p-type layer or i-type layer composed of $Mg_aZn_{1-a}O$-base oxide with a high quality, and consequently being configured as a high-performance and inexpensive light-emitting device capable of emitting ultraviolet or blue light, and a method of fabricating such device. It is therefore a second subject of this invention to provide a light-emitting device having a double hetero-structure using a wide-gap-type oxide semiconductor, capable of efficiently injecting carriers into the active layer, and thereby raising the emission efficiency.

DISCLOSURE OF THE INVENTION

A light-emitting device according to a first aspect of this invention comprises a light-emitting layer portion based on a double hetero-structure, and has at least either of an active layer and a p-type cladding layer included in the double hetero-structure as being configured as an MgZnO layer which is mainly composed Of $Mg_aZn_{1-a}O$-type oxide (where, $0\leq a\leq1$), wherein the MgZnO layer has, interposed therein, a p-type oxide layer which is different from the $Mg_aZn_{1-a}O$-type oxide and has a p-type conductivity.

A method of fabricating a light-emitting device according to a first aspect of this invention is such as fabricating the light-emitting device which comprises a light-emitting layer portion based on a double hetero-structure, and has at least either of an active layer and a p-type cladding layer included in the double hetero-structure as being configured as an MgZnO layer which is mainly composed of $Mg_aZn_{1-a}O$-type oxide (where, $0\leq a\leq1$); and the method comprises a step of growing the MgZnO layer during which also a p-type oxide layer, which is different from the $Mg_aZn_{1-a}O$-type oxide and has a p-type conductivity, is formed.

As described in the above, the $Mg_aZn_{1-a}O$-type oxide which is likely to cause oxygen deficiency during the growth thereof is only available as of n-type as far as the conventional fabrication method is adopted. For the purpose of obtaining a p-type or i-type $Mg_aZn_{1-a}O$-type oxide indispensable for realizing a light-emitting device, it is necessary to reduce the electron concentration in the oxide. One approach for reducing the electron concentration is to compensate the electrons with holes. More specifically, a p-type dopant (acceptor) such as Li, capable of generating a hole is doped in the $Mg_aZn_{1-a}O$-type oxide so as to compensate the donor, to thereby obtain the i-type or p-type oxide.

The electron concentration caused by the oxygen deficiency, however, has a maximum order of as high as approximately $10^{19}$ cm$^{-3}$ or above, so that any trial to compensate such a large amount of electrons only with a uniform doping of the p-type dopant requires such p-type dopant in an amount still larger than the electron concentration. This results in formation of a coarse heterophase crystal mainly composed of the p-type dopant in MgZnO, and consequently makes it unable to obtain p-type nor i-type $Mg_aZn_{1-a}O$-type oxide with a desirable quality.

In contrast to this, according to the light-emitting device (and a method of fabricating the same) of the first aspect of this invention, the problem is successfully solved by interposing a p-type oxide layer, which is different from $Mg_aZn_{1-a}O$-type oxide and has a p-type conductivity, in the MgZnO layer which is a precursor of the active layer or the p-type $Mg_aZn_{1-a}O$-type oxide cladding layer. Because a function of absorbing and compensating electrons in this configuration is owned by the p-type oxide layer localized in the MgZnO layer, it is no more necessary to add a large amount of dopant, and this is successful in obtaining a p-type or i-type $Mg_aZn_{1-a}O$-type oxide having a desirable quality, and in realizing a high-emission-efficiency, light-emitting device capable of emitting ultraviolet or blue light.

Although the number of formation of the p-type oxide layer is not specifically limited, it is of course desirable in view of expecting a large emission efficiency that the electron compensation effect is exhibited uniformly in the MgZnO. For this purpose, it is preferable to form the p-type oxide layer in a plural number so as to be discrete over the thickness-wise direction of the MgZnO layer, and typically in a periodical manner.

The p-type oxide layer available herein is such as including any one of CuO, NiO and LiO as a major constituent. For the case where CuO is used, a part of Cu may be substituted by a Group III element such as Ga, or by a Group II element such as Sr.

Next, a light-emitting device according to a second aspect of this invention comprises a light-emitting layer portion based on a double hetero-structure, and has a p-type cladding layer included in the double hetero-structure as being mainly composed of an $Mg_aZn_{1-a}O$-type oxide (where, $0 \leq a \leq 1$), wherein the p-type cladding layer has, formed therein, a high-concentration doped layer having a p-type dopant concentration larger than the average concentration of the p-type cladding layer, and being formed so as to have a zonal width not larger than a single-molecular layer of the p-type cladding layer.

A method of fabricating a light-emitting device according to a second aspect of this invention is such as fabricating the light-emitting device which comprises a light-emitting layer portion based on a double hetero-structure, and has a p-type cladding layer included in the double hetero-structure as being mainly composed an $Mg_aZn_{1-a}O$-type oxide (where, $0 \leq a \leq 1$); and the method comprises a step of growing the p-type cladding layer during which also a high-concentration doped layer, having a p-type dopant concentration larger than the average concentration of the p-type cladding layer, is formed.

According to the light-emitting device of the second aspect of this invention, a high-concentration doped layer containing a p-type dopant is formed in the p-type cladding layer mainly composed of the $Mg_aZn_{1-a}O$-type oxide, so as to have a zonal width not larger than a single-molecular layer of the p-type cladding layer, to thereby localize the p-type dopant in, so as to say, the thickness-wise direction. Because the function of absorbing and compensating electrons is owned by the high-concentration doped layer, which is a localized layer of the p-type dopant, it is no more necessary to add a large amount of dopant, and this is successful in obtaining a p-type cladding layer having a desirable quality. Because the high-concentration doped layer is formed so as to have a zonal width not larger than a single-molecular layer of the p-type cladding layer, rather than forming coarse heterophase crystal which is an aggregate of the p-type dopant, there is only a small probability of generating a mismatched heterophase interface or dislocation causative of scattering of the carriers.

Next, a light-emitting device according to a third aspect of this invention comprises a light-emitting layer portion which is composed of a wide-gap-type oxide semiconductor having a band gap energy of 2.2 eV or larger, and the light-emitting layer portion has a double hetero-structure in which a p-type cladding layer, an active layer and an n-type cladding layer are stacked with each other, wherein at least either of the p-type cladding layer and the n-type cladding layer comprises:

a first crystal layer which is disposed in adjacent to the active layer so as to form a hetero junction, and functions as a barrier layer against carriers; and a second crystal layer which is disposed in adjacent to the first crystal layer, and on the side thereof opposite to the active layer, and has a band gap energy smaller than that of the first crystal layer.

In the light-emitting device according to the third aspect of this invention, a portion of the cladding layer adjacent to the active layer is configured as the first crystal layer which functions as a potential barrier, and in a style adjacent to the first crystal layer, and on the side thereof opposite to the active layer, the second crystal layer, of which band gap energy is smaller than that of the first crystal layer, is formed. Carriers moving within the second crystal layer are dammed up by the potential barrier formed by the first crystal layer, and are temporarily reserved in an area close to the boundary between the first crystal layer and the second crystal layer, to thereby raise the carrier concentration (the area having a raised carrier concentration is referred to as "carrier reservoir", hereinafter). This allows the cladding layer to reserve the carriers in the carrier reservoir located in the vicinity of the active layer, even if the cladding layer is composed of a crystal capable of achieving only a low carrier density, and this makes it possible to realize a high-luminance, light-emitting device having an enhanced carrier injection efficiency to the active layer.

In view of effectively inject the carriers into the active layer, the thickness t of the first crystal layer is adjusted within a range from 50 Å to 500 Å. The carriers in the carrier reservoir flows into the active layer by climbing over the potential barrier formed by the first crystal layer, or punching through the potential barrier based on the tunneling effect. Raising the reserving effect of the carriers into the carrier reservoir is effective to raise the carrier injection efficiency into the active layer, and for this purpose, it is necessary to suppress the punching-through of the carriers through the potential barrier based on the tunneling effect. The thickness t of the first crystal layer of less than 50 Å may actualize the tunneling effect, and may ruin the effect of increasing the carrier density in the carrier reservoir, so that the effect of enhancing the emission luminance cannot fully be achieved. On the other hand, increase in the thickness t of the first crystal layer may relieve the effect of the tunneling effect, but the thickness t exceeding 500 Å may excessively increase the resistance against the flow of the carriers in the carrier reservoir to climb over the potential barrier formed by the first crystal layer, and may reduce the carrier density flowing into the active layer, so that the effect of enhancing the emission luminance again cannot fully be achieved.

For the wide-gap-type oxide semiconductor composed of a Group II-VI compound, as will be represented by MgZnO later, it is not so easy to obtain a p-type semiconductor layer having a low resistivity (i.e., high carrier concentration). Because p-type carrier (hole) has an effective mass larger than that of n-type carrier or electron, and consequently has a smaller mobility, so that, how the injection efficiency of the p-type carrier into the active layer can be raised holds the key for obtaining a high-luminance, light-emitting device. As a solution for this, formation of the first crystal layer and the second crystal layer at least on the p-type-cladding-layer side is successful in effectively increasing the injection efficiency of the p-type carrier into the active layer, and in further raising the emission efficiency.

The first crystal layer can be configured as having a quantum well structure in which barrier layers and well layers, differed from each other in the band gap energy, are alternately stacked. In the quantum well structure, the carriers are localized in the well layers and become less likely to be affected by scattering, and this makes it possible to inject the carriers, even in a small amount, into the active layer without causing waste and to enhance the emission efficiency. In an exemplary case where a single quantum well structure is adopted, the carriers are confined in the well layers in a quantized manner, and forms a confinement energy level lower than the height of the potential barrier formed by the first crystal layer. As a consequence, the carriers in the carrier reservoir can flow into the active layer via the low confinement energy level, and the density of the carrier injected into the active layer can be improved. In another exemplary case where a multiple quantum well structure is adopted, a sub-band having a energy level further lower than that of the confinement energy level in the single quantum well structure is formed, and this makes it possible to further efficiently inject the carriers in the carrier reservoir into the active layer, to thereby enhance the emission efficiency.

For the case the quantum well structure is adopted, in order to functionalize the quantum confinement effect of the carriers, the thickness $t_B$ of the barrier layer is preferably adjusted within a range from 50 Å to 150 Å, and the thickness $t_W$ of the well layer is adjusted within a range from 15 Å to 150 Å. The thickness $t_W$ of the well layer exceeding 150 Å will no more functionalize the quantum confinement effect of the carriers. The thickness $t_W$ of the quantum well layer less than 15 Å will make it difficult to keep the crystal structure necessary for retaining a desirable band structure for realizing the quantum well structure. On the other hand, for the case the single quantum well structure is adopted, the thickness $t_B$ of the barrier layer less than 50 Å will degrade the function of the barrier layer due to tunneling effect, and again will no more functionalize the quantum confinement effect of the carriers. The thickness $t_B$ of the barrier layer exceeding 150 Å will reduce, in the process of injecting the carriers in the carrier reservoir to the active layer, the probability of punching of the carriers through the barrier layer based on the tunneling effect, and this undesirably results in a lowered density of the carriers injected into the active layer. In the multiple quantum well structure, the thickness $t_B$ of the barrier layer other than those in the quantum well structure in adjacent to the active layer and the second crystal layer preferably fall within a range from 50 Å to 150 Å so as not to interfere the sub-band formation, and the thickness $t_B$ of the other barrier layers preferably fall within a range from 50 Å to 150 Å similarly to those in the single quantum well structure.

In the light-emitting device according to the third aspect of this invention, $Mg_xZn_{1-x}O$ ($0 \leq x \leq 1$) is adopted as the wide-gap-type oxide semiconductor. In $Mg_xZn_{1-x}O$ ($0 \leq x \leq 1$), ZnO is an n-type semiconductor in its non-doped status, and MgO is an insulator in its non-doped status, so that the MgZnO alloy has a larger insulating property as the alloy composition increases. As a consequence, carrier injection by doping into $Mg_xZn_{1-x}O$ ($0 \leq x \leq 1$) becomes more difficult as the alloy composition (x) increases. This means that a sufficient number of carriers cannot be doped even if the p-type cladding layer and n-type cladding layer composed of $Mg_xZn_{1-x}O$ ($0 \leq x \leq 1$) are desired, and places a hurdle on the process of manufacturing a high-luminance, light-emitting device. Whereas, the light-emitting layer portion in this invention is successful in raising the carrier density in the carrier reservoir located in the vicinity of the active layer, even if the cladding layer is composed of a material capable of attaining only a low carrier density, and therefore successful in raising the density of carriers injected into the active layer even if the p-type cladding layer and n-type cladding layer is formed using $Mg_xZn_{1-x}O$ ($0 \leq x \leq 1$).

For the case where the first crystal layer is composed of a single layer, it is necessary for the first crystal layer to satisfy the relation of $x_H > x_L$ if the layer is desired to function as a barrier layer, where $x_H$ is the MgO alloy composition x of the first crystal layer, and $x_L$ is the MgO alloy composition x of the second crystal layer, because the band gap energy will increase as the MgO alloy composition x increases. The alloy compositions $x_H$ and $x_L$ of the individual layers are preferably adjusted within ranges of $0.10 \leq x_H \leq 0.65$ and $0.01 \leq x_L \leq 0.40$, respectively. This is because the alloy composition $x_L$ of the second crystal layer exceeding 0.40 results in a lowered carrier generation efficiency by the doping, and any trial for recovering this nonconformity by increasing the amount of dopant may result in degradation of the crystal quality. On the other hand, $x_L$ of less than 0.01 is unsuccessful in ensuring a sufficient level of difference in the band gap energies between the active layer and the second crystal layer, and this makes it impossible to efficiently inject the carriers into the active layer.

On the other hand, the alloy composition $x_H$ of the first crystal layer of less than 0.01 results in only an insufficient function of the first crystal layer as the barrier layer, and in only an insufficient carrier reserving effect in the carrier reservoir. Whereas, $x_H$ exceeding 0.65 undesirably increases the probability of the carriers in the carrier reservoir incapable of climbing over the potential barrier formed by the first crystal layer. Both cases result in lowering in the emission efficiency. The barrier height of the first crystal layer over the second crystal layer preferably resides in a range from 0.15 eV to 1.00 eV. This is preferably realized by adjusting $x_H-x_L$ within a range from 0.14 to 0.69.

The first crystal layer is preferably adjusted so as to have a carrier concentration lower than that of the second crystal layer. This is because the first crystal layer has a large alloy composition x, and therefore has a large content ratio of insulating MgO, so that any trial of increasing the carrier concentration may result in degradation of the crystal quality in association with the increase in the amount of dopant. It is also allowable to configure the first crystal layer as a non-doped layer.

For the case where the first crystal layer has a quantum well structure, the relation of $x_B > x_W$ should be satisfied, where $x_B$ is the alloy composition x of the barrier layer, and $x_W$ is the alloy composition x of the well layer. The alloy compositions $x_B$ and $x_W$ of the individual layers are preferably adjusted within ranges of $0.10 \leq x_B \leq 0.65$ and $0.01 \leq x_W \leq 0.40$, respectively. The alloy composition $x_W$ of the well layer exceeding 0.40 results in a lowered carrier generation efficiency by the doping, and any trial for recovering this nonconformity by increasing the amount of dopant may result in degradation of the crystal quality. On the other hand, $x_W$ of less than 0.01 is unsuccessful in ensuring a sufficient level of difference in the band gap energies between the active layer and the well layer, and this makes it impossible to efficiently inject the carriers into the active layer.

On the other hand, the alloy composition $x_B$ of the barrier layer of less than 0.10 results in only an insufficient barrier height, an increased probability of flow-out of the carriers from the well layer to the barrier layer, and only an insufficient confinement effect of the quantum well structure. Whereas, $x_B$ exceeding 0.65 excessively increases the probability of the carriers in the carrier reservoir incapable of climbing over the potential barrier formed by the barrier layer. Both cases result in lowering in the emission efficiency. The barrier height of the barrier layer over the well layer preferably resides in a range from 0.15 eV to 1.00 eV. This is preferably realized by adjusting $x_B-x_W$ within a range from 0.14 to 0.69.

The barrier layer is preferably adjusted so as to have a carrier concentration lower than that of the well layer. This is because the barrier layer has a large alloy composition x, and therefore has a large content ratio of insulating MgO, so that any trial of increasing the carrier concentration may result in degradation of the crystal quality in association with the increase in the amount of dopant. It is also allowable to configure the barrier layer as a non-doped layer.

The p-type cladding layer composed of the MgZnO-type oxide used in this invention contains, as the p-type dopant, any one element, or two or more elements selected from Li, Na, Cu, N, P, As, Al, Ga and In. The p-type carrier can be doped by substituting the sites of Mg and Zn, which are Group II elements, with Li or Na, which is a Group I element, and by substituting the site of O, which is a Group VI element, with N, P or As, which is a Group V element. Cu can function as a p-type dopant, because Cu doped therein can form CuO, and CuO is a p-type semiconductor in its non-doped status. On the other hand, Al, Ga, In and Li can ensure a desirable p-type characteristic in a more exact manner when co-added with N. As for the MgZnO-type oxide, selection of the p-type dopant having an ionic radius close to that of Zn or O element is supposed to be advantageous in view of preventing the crystal quality of the p-type cladding layer from being degraded. As the p-type dopant, it is therefore preferable to select N, and any one element, or two or more elements selected from Ga, Al and In, particularly Ga.

The n-type cladding layer composed of the MgZnO-type oxide preferably contains, as the n-type dopant, any one element, or two or more elements selected from B, Al, Ga and In. The n-type carrier can be doped by substituting Mg and Zn, which are Group II elements, with B, Al, Ga or In, which is a Group III element. As the n-type dopant, it is therefore preferable to select Ga, having an ionic radius close to that of Zn element considering the crystal quality of the n-type cladding layer, similarly to the p-type dopant.

The $Mg_aZn_{1-a}O$-type oxide can be formed by the vapor phase growth process, where the sputtering process or MBE process is of course adoptable, but the MOVPE process has advantages as described in the next. In the MOVPE process in which the oxygen partial pressure during the growth can arbitrarily be varied, generation of the oxygen elimination and the resultant oxygen deficiency can effectively be suppressed by raising the atmospheric pressure to a certain extent. Consequently, it is made possible to realize a p-type $Mg_aZn_{1-a}O$-type oxide layer indispensable for the light-emitting device, and in particular, a p-type $Mg_aZn_{1-a}O$-type oxide layer having a concentration of oxygen deficiency suppressed to as low as $10/cm^3$ or below. The lower concentration of oxygen deficiency is the better (that is, the concentration is not precluded from becoming $0/cm^3$).

Growth of the p-type MgZnO cladding layer or the MgZnO active layer by the MOVPE process is successful in more effectively suppressing generation of the oxygen deficiency during the layer growth, and in obtaining the p-type MgZnO cladding layer or the MgZnO active layer having desirable characteristics by being grown in the atmosphere under the pressure exceeding 10 Torr ($1.3 \times 10^3$ Pa). In this case, it is more preferable to adjust the oxygen partial pressure (defined so as to include any oxygen-containing molecules other than $O_2$ after converting their constitutive oxygen into $O_2$) to 10 Torr ($1.3 \times 10^3$ Pa) or above.

On the other hand, the MBE process, in which the p-type MgZnO cladding layer or the MgZnO active layer is grown under a ultra-high vacuum (ca. $10^{-10}$ Torr), is less capable of suppressing generation of the oxygen deficiency as compared with the MOVPE process, but is more advantageous in controlling the layer in an atomic layer level. This consequently makes it possible to improve the crystallinity of the p-type MgZnO cladding layer or the MgZnO active layer. In the light-emitting device according to the first aspect of this invention, adoption of the MBE process makes it possible to precisely control the p-type oxide layer and/or high-concentration doped layer interposed in the p-type cladding layer, and to thereby form the p-type cladding layer having a further improved quality.

As the p-type dopant, it is necessary to select those capable of functioning as effective p-type dopants with respect to the MgZnO-type oxide. For the p-type dopants, one element, or two or more elements selected from N, Ga, Al, In, Li, Si, C and Se are available. Among these, use of N is particularly preferable in view of obtaining desirable p-type characteristics of MgZnO. Among the metal element dopants, one element, or two or more elements selected from Ga, Al, In and Li, are effectively used, and Ga is particularly effective. Co-addition of these elements with N is successful in exactly obtaining desirable p-type characteristics. By composing the high-concentration doped layer using these p-type dopants, it is made possible to improve the quality of the p-type cladding layer composed mainly of the MgZnO-type oxide.

In order to secure satisfactory emission characteristics, the p-type carrier concentration in the p-type MgZnO-type oxide layer (e.g., p-type cladding layer) is preferably adjusted within a range from $1 \times 10^{16}/cm^3$ to $8 \times 10^{18}/cm^3$. The p-type carrier concentration of less than $1 \times 10^{16}/cm^3$ may makes it difficult to obtain a sufficient emission luminance. On the other hand, the p-type carrier concentration exceeding $8 \times 10^{18}/cm^3$ may excessively increase the amount of the p-type carriers injected into the active layer, and this may cause reverse diffusion of the p-type carriers back into the p-type MgZnO-type oxide layer (e.g., p-type cladding layer), or increase in a portion of the p-type carriers not contributive to the light emission due to flow into the n-type cladding layer after climbing over the barrier, and consequently results in a lowered emission efficiency. Also for the n-type MgZnO-type oxide layer, the n-type carrier concentration is preferably adjusted within a range from $1 \times 10^{16}/cm^3$ to $8 \times 10^{18} cm^3$, for the similar reasons.

Materials for composing a substrate used for the layer growth include aluminum oxide, gallium oxide, magnesium oxide, zinc oxide, gallium nitride, aluminum nitride, silicon, silicon carbide, gallium arsenide, indium-tin complex oxide and glass. Embodiments of the substrate preferably adopted to this invention are as follows. The $Mg_aZn_{1-a}O$-type oxide has wurtzite-type crystal structure as shown in FIG. 2, in which metal atom layers and oxygen atom layers are alternately stacked in the c-axis direction, where the oxygen atoms are arranged conforming the hexagonal system. Therefore the substrate is preferably an oxide single crystal substrate having an atomic arrangement such that the oxygen atoms conform to the hexagonal system, and having the C plane ((0001) plane) in the atomic arrangement conforming to the hexagonal system as the main surface, in view of improving crystal matching property with the $Mg_aZn_{1-a}O$-type oxide, and in obtaining the light-emitting layer portion having a desirable crystallinity. In this case, the entire portion of the buffer layer is configured as the $Mg_aZn_{1-a}O$-type oxide layer, and is formed on the main surface of the oxide single crystal substrate so that the c-axis of the wurtzite-type crystal structure is oriented to the thicknesswise direction. This type of oxide single crystal substrate is exemplified by a corundum-structured oxide, and a further specific example thereof can be exemplified by a sapphire substrate.

BEST MODE FOR CARRYING OUT THE INVENTION

The following paragraphs will describe best modes for carrying out this invention referring to the attached drawings.

(Embodiment 1)

Figure 1:
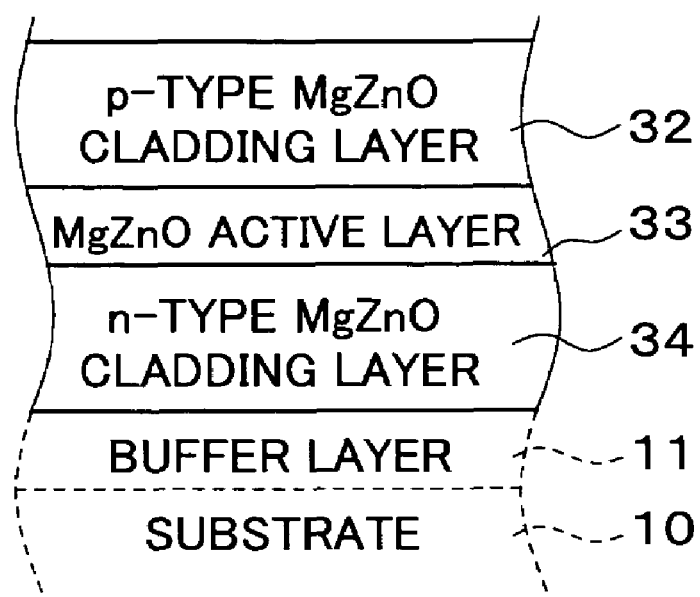
FIG. 1 is a conceptual drawing of a double-heterostructured, light-emitting layer portion composed of MgZnO according to a first embodiment of this invention.

FIG. 1 schematically shows a stacked structure of an essential portion of a light-emitting device according to the first embodiment of this invention (a light-emitting device of the first aspect of the invention), and the device has a light-emitting layer portion in which an n-type cladding layer 34, an active layer 33 and a p-type cladding layer 32 are stacked in this order. The layers 32 to 34 are configured as $Mg_aZn_{1-a}O$-type oxide layers ($0 \leq a \leq 1$, also referred to as MgZnO hereinafter: it is to be understood that notation MgZnO does not mean the compositional ratio of "Mg:Zn:O=1:1:1" as is obvious from the variable range of the alloy composition "a", and further includes a concept of a single-component oxide such as MgO or ZnO). The p-type MgZnO cladding layer 32 contains one element, or two or more elements selected from N, Ga, Al, In and Li, in a slight amount as a p-type dopant. The p-type carrier concentration is adjusted within a range from $1 \times 10^{16}/cm^3$ to $8 \times 10^{18}/cm^3$, and typically within a range from $10^{17}/cm^3$ to $10^{18}/cm^3$, as described in the above.

Figure 2:
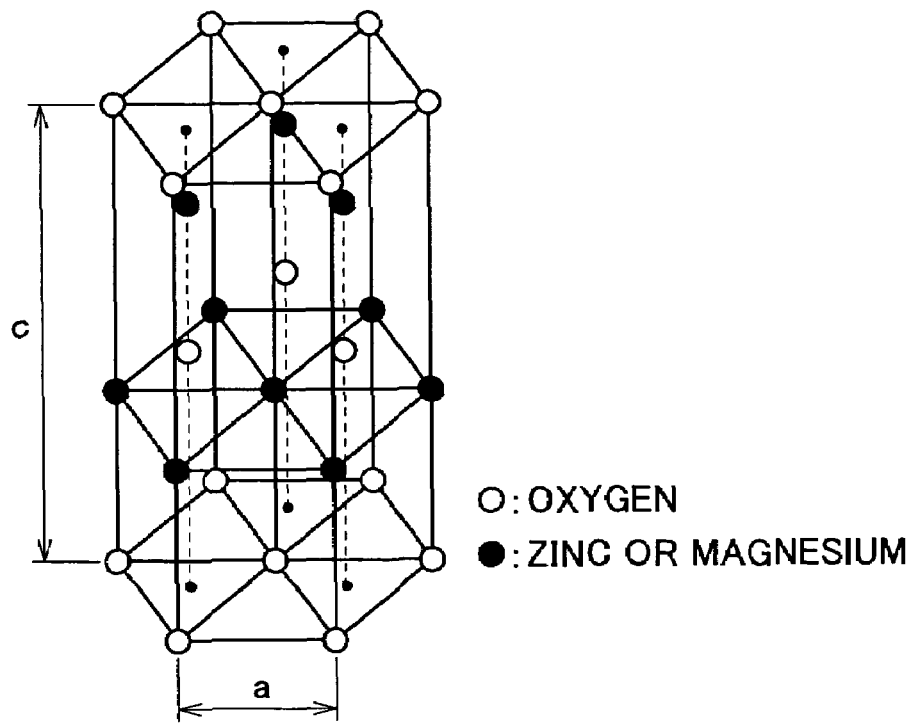
FIG. 2 is a schematic drawing of a crystal structure of MgZnO.
Figure 3:
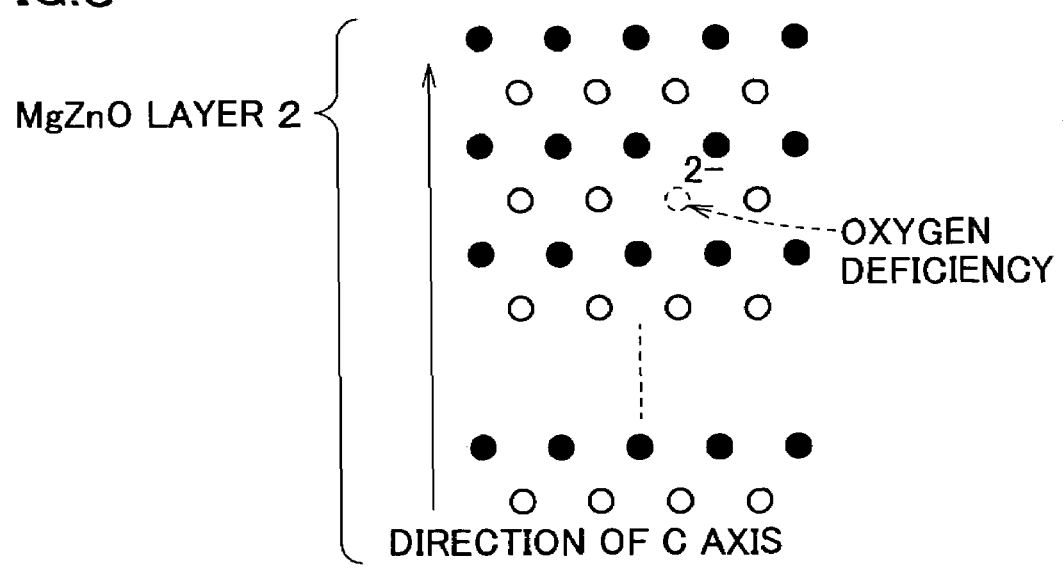
FIG. 3 is a schematic drawing of a style of arrangement of metal ions and oxygen ions in an MgZnO layer.

FIG. 2 shows a crystal structure of MgZnO, where so-called wurtzite-type structure is shown. In this structure, oxygen atom layers and metal atom (Zn ion or Mg ion) layers are alternately stacked in the direction of the c-axis, and the c-axis is oriented to the thickness-wise direction as shown in FIG. 3. Omission of an oxygen ion to cause a vacancy results in oxygen deficiency, and generates an electron as an n-type carrier. An excessive formation of the oxygen deficiency undesirably increases the n-type carrier, and ruins the p-type conductivity. It is therefore essential to suppress the generation of the oxygen deficiency in the process of forming the p-type MgZnO cladding layer 32 and the MgZnO active layer 33.

The active layer 33 is composed of a material having an appropriate band gap depending on desired emission wavelength. For example, for those available for visible light emission, materials having band gap energies $E_g$ (3.10 to 2.18 eV or around), capable of causing light emission in a wavelength range of 400 to 570 nm, are selected. Although this range covers emission wavelength from violet region to green region, those having band gap energies $E_g$ (2.76 to 2.48 eV or around) capable of causing light emission in a wavelength range of 450 to 500 nm are selected in particular for the case where blue light emission is desired. On the other hand, those having band gap energies $E_g$ (4.43 to 3.10 eV or around) capable of causing light emission in a wavelength range of 280 to 400 nm are selected in particular for the case where ultraviolet emission is desired.

Figure 4:
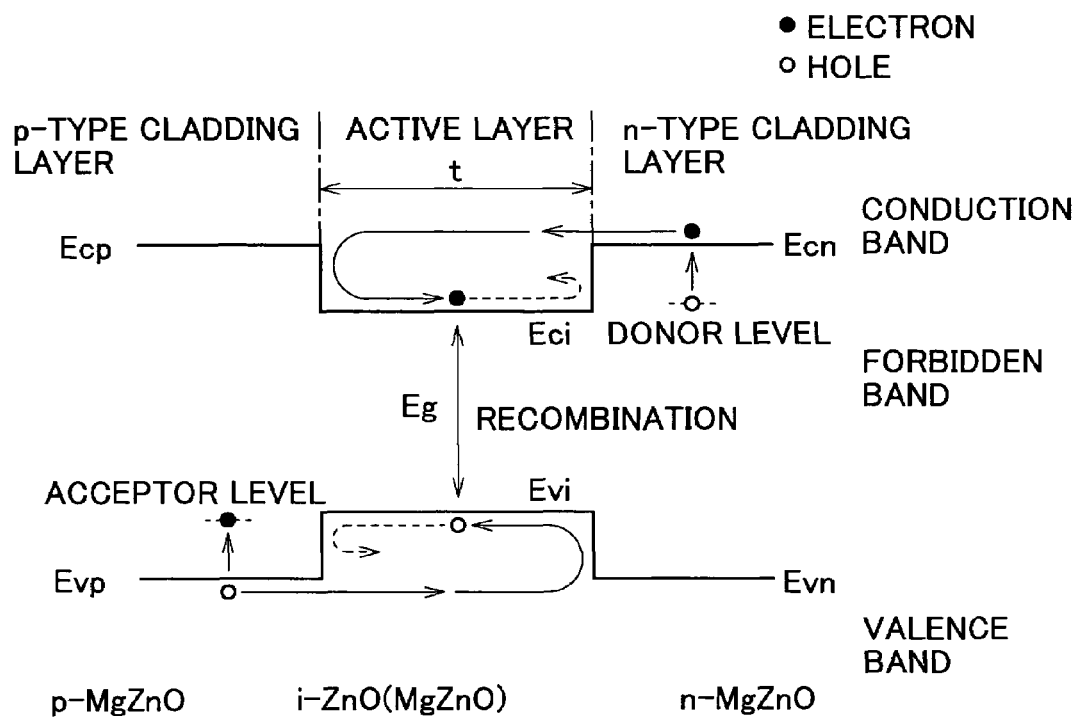
FIG. 4 is a band chart of a light-emitting device based on a junction structure conforming to Type-I band lineup.

The active layer 33 can be formed typically using a semiconductor capable of forming a Type-I band lineup between itself and the p-type $Mg_xZn_{1-x}$O-type oxide layer. This sort of active layer 33 can be configured as an $Mg_yZn_{1-y}$O-type oxide layer (where, $0 \leq y < 1$, $x > y$: also referred to as MgZnO active layer, hereinafter). It is to be noted now that "a Type-I band lineup is formed between the active layer and the p-type MgZnO cladding layer" means a junction structure, as shown in FIG. 4, in which the individual energy levels of the bottom of the conduction band and the upper end of the valence band $E_{cp}$, $E_{vp}$ of the p-type cladding layer (p-type MgZnO cladding layer 32), and the individual energy levels of the bottom of the conduction band and the upper end of the valence band $E_{ci}$, $E_{vi}$ of the active layer satisfy the following relations of inequality:

$$E_{ci} < E_{cp} \quad (1)$$

$$E_{vi} > E_{vp} \quad (2)$$

In this structure, potential barriers will appear for both of the forward diffusion of holes from the active layer 33 to the n-type cladding layer 34, and the forward diffusion of electrons (n-type carriers) to the p-type cladding layer 32. If the material for the n-type cladding layer 34 is appropriately selected so as to form Type-I band lineup between the active layer 33 and the n-type cladding layer 34, similarly to as shown in FIG. 4, the active layer will have well-like potential barriers formed therein both at the bottom of the conduction band and the upper end of the valence band, and will enhance confinement effect both for electrons and holes. This consequently results in more enhanced effects of promoting carrier recombination and of improving emission efficiency.

In the MgZnO active layer 33, a value of the alloy composition y serves as a factor for determining the band gap energy $E_g$. The value is selected within a range of $0 \leq y \leq 0.5$ for the case where ultraviolet emission within a wavelength from 280 nm to 400 nm is desired. The height of the potential barrier formed therein is preferably adjusted from 0.1 eV to 0.3 eV or around for light-emitting diode, and from 0.25 eV to 0.5 eV or around for semiconductor laser light source. The value can be determined by appropriately selecting the alloy compositions x, y and z in the p-type $Mg_xZn_{1-x}$O cladding layer 32, the $Mg_yZn_{1-y}$O active layer 33 and the n-type $Mg_zZn_{1-z}$O cladding layer 34.

Figure 6:
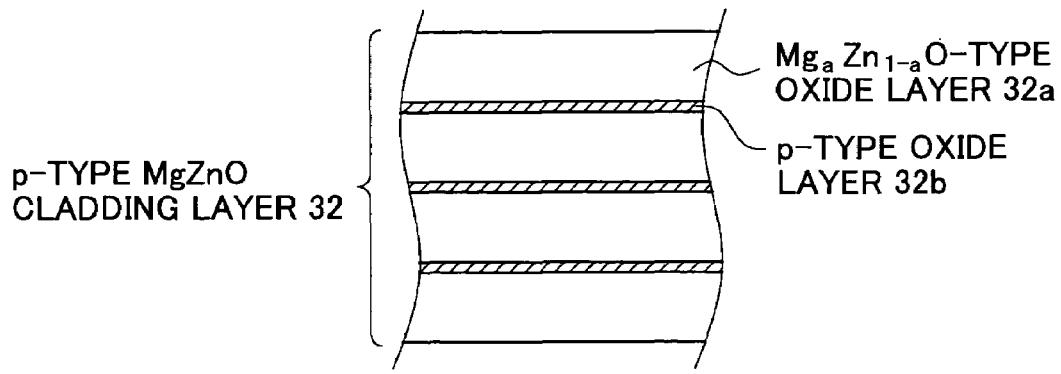
FIG. 6 is a schematic drawing of a structure of a p-type MgZnO cladding layer of the light-emitting device shown in FIG. 5.

In this embodiment, as shown in FIG. 6, p-type oxide layers 32b composed of an oxide different from the $Mg_zZn_{1-z}$O-type oxide, which is typically CuO, NiO or LiO, are interposed in the p-type MgZnO cladding layer 32. With respect to these p-type oxide layers 32b, $Mg_zZn_{1-z}$O-type oxide layers 32a doped so as to have a p-type conductivity are alternately stacked. By adopting this structure, it is made possible to obtain a desirable p-type conduction property even if the p-type dopant concentration in the $Mg_zZn_{1-z}$O-type oxide layers 32a is lowered, because electrons existing in a form of background carrier can be absorbed and compensated by the p-type oxide layers 32b. It is therefore made possible to obtain p-type or i-type MgZnO oxide layer having a desirable quality, while making it less likely to generate hetero-phase regions in which the p-type dopant are condensed.

The thickness of the p-type oxide layer 32b is adjusted to as thin as allowing it to exhibit quantum effect, and so as not to allow it to function as a light-emitting layer, making use of the tunneling effect. In contrast to this, the $Mg_zZn_{1-z}$O-type oxide layer 32a in contact with the p-type oxide layer 32b functions as a kind of barrier layer, and is required to show properties of a bulk crystal, so that the thickness thereof is adjusted to 15 nm or larger so as not to actualize effects of the tunneling effect.

The p-type oxide differs from MgZnO both in the crystal structure and lattice constant. On the other hand, the p-type oxide layer 32b may cause scattering of the carriers due to dislocation or the like generated therein, and may result in lowering of the emission efficiency unless it is formed in the p-type MgZnO cladding layer 32 in a lattice-matched style with the $Mg_zZn_{1-z}$O-type oxide layer 32a. In this case, too large thickness of the p-type oxide layer 32b may result in lattice mismatching with respect to the $Mg_zZn_{1-z}$O-type oxide layer 32a adjacent thereto through lattice relaxation, and may undesirably result in penetrative dislocation in the layer grown thereafter. To avoid this nonconformity, the p-type oxide layer 32b must be formed to a thickness not causative of the lattice relaxation (critical thickness), and more specifically, the layer is preferably formed to a thickness of 20 nm or smaller. In an exemplary case where the p-type oxide layer 32b is configured using CuO or NiO, the layer is preferably formed to a thickness equivalent to a single molecular layer or to as much as 3-to-5 molecular layers because the critical thickness necessary for attaining lattice matching with MgZnO is equivalent to approximately 3 to 5 molecular layers, and the MgZnO layer 32a in contact therewith is preferably formed to a thickness of 20 nm or smaller, and more specifically 15 nm or around.

The number of formation of the p-type oxide layer 32b is not specifically limited, but it is of course preferable that electron compensation effect is uniformly exhibited in the target MgZnO layer in view of expecting a high emission efficiency. For this purpose, as shown in FIG. 6, it is preferable to form two or more, that is, a plurality of p-type oxide layers 32b in a discrete manner in the thickness-wise direction of the p-type MgZnO cladding layer 32, and typically in a periodical manner. For the case where the plurality of the p-type oxide layers 32b are formed, the individual p-type oxide layers 32b and the individual $Mg_zZn_{1-z}$O-type oxide layer alternately stacked therewith are preferably formed while adjusting the thickness thereof within the above-described ranges.

Figure 5:
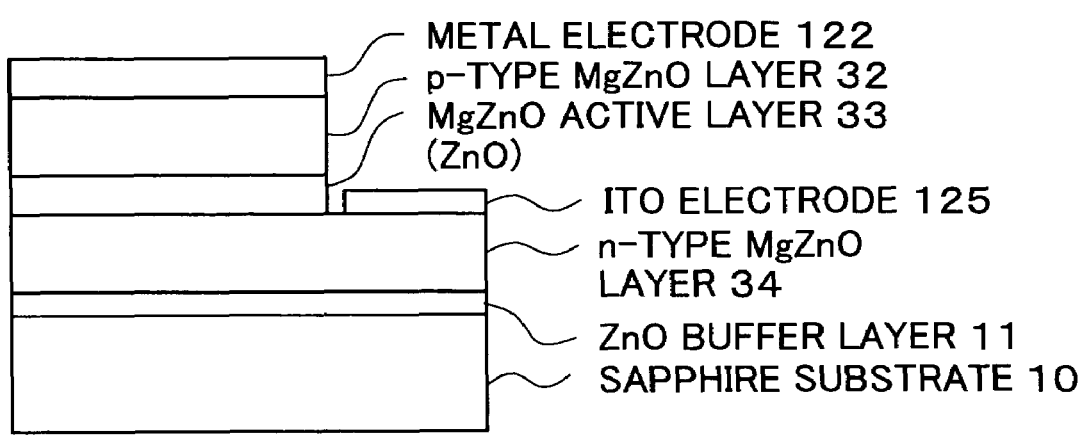
FIG. 5 is a specific example of a light-emitting device of this invention.

The following paragraphs will describe one exemplary process for fabricating the light-emitting device. First, as shown in FIG. 5, a buffer layer 11 composed of ZnO is epitaxially grown on a sapphire substrate 10. Next, the n-type MgZnO cladding layer 34, the MgZnO active layer 33, and the p-type MgZnO cladding layer 32 are formed in this order (inverted order of the growth also acceptable). The epitaxial growth of the individual layers can be carried out by the MOVPE process or the MBE process. The following explanation will be represented by the MOVPE process.

By the MOVPE process, the buffer layer 11, n-type MgZnO cladding layer 34, MgZnO active layer 33 and the p-type MgZnO cladding layer 32 (including the p-type MgZnO cladding layer 32b in FIG. 6) can successively be formed in a single reaction chamber. The temperature in the reaction chamber can be adjusted by a heating source (infrared lamp in this embodiment) so as to promote chemical reactions for the layer growth. Examples of the major materials for growing the individual layers are such as follows:

oxygen source: preferably supplied in a form of oxidative compound gas in view of suppressing an excessive reaction with organometallic compounds described later, although oxygen gas is allowable, typified by $N_2O$, NO, $NO_2$ and CO, where $N_2O$ (nitrous oxide) adopted in this embodiment;

Zn source gas: dimethyl zinc (DMZn), diethyl zinc (DEZn), etc.;

Mg source gas: bis-cyclopentadienyl magnesium ($Cp_2Mg$), etc.;

Cu source gas: copper hexafluoroacetyl acetonate;

Ni source gas: cyclopentadienyl nickel, methylcyclopentadienyl nickel; and

Li source gas: n-butyl lithium, etc.

Among these, the Cu source gas, Ni source gas and Li source gas are source gases for the p-type oxide.

Examples of the p-type dopant gas include the followings:
Li source gas: n-butyl lithium, etc.;
Si source gas: silicon hydrides such as monosilane;
C source gas: hydrocarbons (typically those containing one or more C atoms); and
Se source gas: hydrogen selenide, etc.

One of, or two or more of Al, Ga and In, which are Group III elements, can be allowed to function as excellent p-type dopants when coadded with N, which is a Group V element. Examples of the dopant gas include the followings:
Al source gas: trimethyl aluminum (TMAl), triethyl aluminum (TEAl), etc.;
Ga source gas: trimethyl gallium (TMGa), triethyl gallium (TEGa), etc.; and
In source gas: trimethyl indium (TMIn), triethyl indium (TEIn), etc.

For the case where N is used as a p-type dopant together with a metal element (Ga), the p-type MgZnO cladding layer is grown while supplying a gas which serves as an N source together with an organometallic gas which serves as a Ga source. In particular in this embodiment, $N_2O$ used as an oxygen component source also serves as an N source.

The n-type conductivity of the n-type MgZnO cladding layer 34 can be obtained by intentionally producing oxygen deficiency by reducing the oxygen partial pressure during the growth, or can be obtained by singularly adding a Group III element such as B, Al, Ga or In as an n-type dopant. As for Al, Ga and In, the dopant gases described in the above in relation to the p-type dopant are similarly available. As for B, diborane ($B_2H_6$) can typically be used.

The individual source gases are fed into the reaction chamber after being appropriately diluted with a carrier gas (nitrogen gas, for example). Ratio of flow rates of the organometallic compound gases MO which respectively serves as Mg source and Zn source is controlled using mass flow controllers MFC or the like, corresponding to variety in the alloy composition of the individual layers. Also flow rates of $N_2O$, which is an oxygen component source gas, and a dopant source gas are controlled by the mass flow controllers MFC.

The buffer layer 11 is grown as descried in the next. The substrate 10 on which the layers are grown is a sapphire (i.e., single-crystalline alumina) substrate having the c-axis as the principal crystal axis, where the main surface on the oxygen atom surface side is used as a layer growth surface. Prior to the layer growth, the substrate 10 is thoroughly annealed under an oxidative gas atmosphere. The oxidative gas may be any of those selected from $O_2$, CO and $N_2O$, where $N_2O$ is selected in this embodiment so as to be used also as the oxygen component source gas in the layer growth described later. For the case where the annealing is carried out in the reaction chamber for the MOVPE process, the annealing is preferably carried out at the annealing temperature of 750° C. or above (but lower than the melting point of the substrate), for a holding time of 30 minutes or more. It is, however, also allowable to shorten the above-described annealing time if the surface of the substrate can be cleaned to a satisfactory level by wet cleaning or the like.

After completion of the annealing, the substrate temperature is lowered to a first temperature which is set to 250 to 350° C. (set to 350° C. in this embodiment) in order to suppress generation of the oxygen deficiency, while keeping the oxidative gas atmosphere unchanged. After the temperature is stabilized at a set value, supply of the oxidative gas is interrupted, and the gas is then thoroughly purged out by replacing the inner atmosphere of the reaction chamber with nitrogen gas. It is preferable to set the purging time to 5 seconds or longer, although variable depending on the geometry and capacity of the reaction chamber.

Next, the organometallic gas MO is supplied into the reaction chamber, and the first metal atomic layer which composes a part of the buffer layer 11 typically shown in FIG. 1 is formed as a mono-atomic layer by the ALE (atomic layer epitaxy) process. Growth of a metal atomic layer in the ALE process saturates once a single atomic layer is completed based on the self-termination mechanism, and further growth of the metal atomic layer would not occur even under a continued supply of the organometallic compound gas MO. Thereafter the supply of the organometallic gas MO is interrupted, the gas is thoroughly purged out by replacing the inner atmosphere of the reaction chamber with nitrogen gas, $N_2O$ is introduced as the oxygen component source gas (and also as a gas for creating the oxidative atmosphere), and the oxygen atom layer is formed only by a single atomic layer by the ALE process. This results in the formation of the MgZnO layer only by a single atomic layer on the substrate 10.

The temperature in the reaction chamber is thereafter elevated to a second temperature which is set to 400 to 800° C. (set to 750° C. in this embodiment) while keeping the oxidative gas atmosphere unchanged, and by continuously supplying the organometallic gas (metal source gas), the residual portion of the buffer layer is formed by the general MOVPE process. In view of obtaining the buffer layer excellent both in the crystallinity and planarity, it is also preferable to grow the first plurality of layers by the ALE process.

Figure 7:
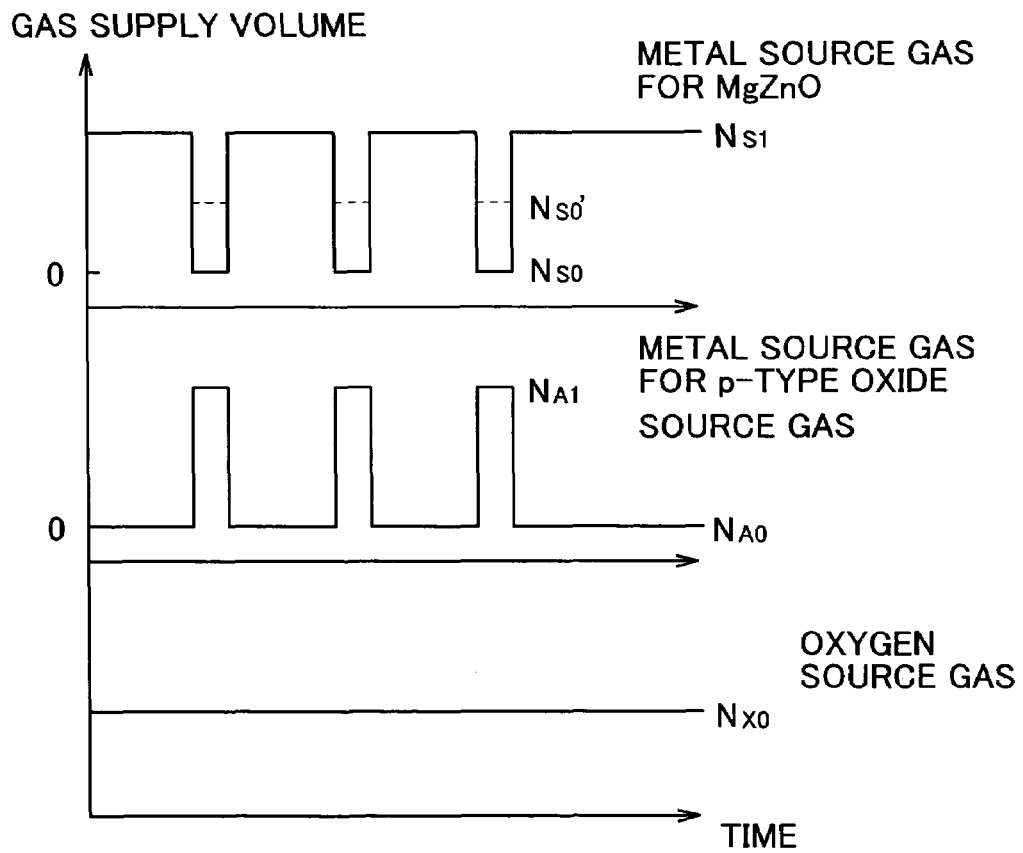
FIG. 7 is a schematic drawing of an exemplary gas supply sequence during formation of the p-type MgZnO cladding layer shown in FIG. 6 by the MOVPE process.

After completion of the formation of the buffer layer 11, the n-type MgZnO cladding layer 34, the MgZnO active layer 33 and the p-type MgZnO cladding layer 32 are formed in this order by the MOVPE process. Among these, the p-type MgZnO cladding layer 32 has to be grown as a layer in which the $Mg_zZn_{1-z}O$-type oxide layer 32a and the p-type oxide layers 32b are alternately stacked as shown in FIG. 6. FIG. 7 shows an exemplary gas supply sequence during the growth of the p-type MgZnO cladding layer 32. In this sequence, the supply volume of the metal source gas for MgZnO is changed so that a large-flow-volume period having a supply volume of $N_{S1}$ and a small-flow-volume period having a supply volume of $N_{S0}$, smaller than $N_{S1}$, appear in an alternate manner, and the supply volume of the metal source gas for the p-type oxide is changed so that a small-flow-volume period corresponded to the large-flow-volume period of the metal source gas for MgZnO (flow volume: $N_{A0}=0$) and a large-flow-volume period corresponded to the small-flow-volume period of the metal source gas for MgZnO (flow volume: $N_{A1}$) appear in an alternate manner. On the other hand, the oxygen source gas is supplied in a stationary manner at a predetermined flow volume $N_{X0}$. This allows an intermittent growth of the plurality of p-type oxide layers 32b during the growth of the p-type MgZnO cladding layer 32.

When the p-type oxide layers 32b are grown in an intermittent manner, it is allowable to simultaneously proceed the growth of the p-type oxide layers 32b while keeping the growth of the $Mg_zZn_{1-z}O$-type oxide layers 32a uninterrupted. In this case, as shown in FIG. 7, the supply volume of the metal source gas for MgZnO is adjusted to a constant value $N_{S0}'$, but not zero, even during the small-flow-volume period. The p-type oxide layers 32b in this case will be formed so that the p-type oxide and MgZnO are mixed therein.

On the other hand, it is also allowable to grow the p-type oxide layers 32b while keeping the growth of the $Mg_zZn_{1-z}O$-type oxide layers 32a interrupted. In FIG. 7, this means that the flow volume $N_{S0}$ of the metal source gas for MgZnO in the small-flow-volume period falls to zero. When the growth of the p-type oxide layers 32b is proceeded while interrupting the growth of the $Mg_zZn_{1-z}O$-type oxide layers 32a, period of the interruption can act as a kind of annealing period, and makes it possible to glow the p-type cladding layer 32 having an improved crystallinity and less defects. Generation of defects, such as oxygen deficiency, can more effectively be prevented if the supply of the metal source gas for MgZnO is interrupted, only the supply of the oxygen source gas is kept continued for a predetermined period, and is then replaced by the supply of the metal source gas for p-type oxide.

During the growth of the $Mg_zZn_{1-z}O$-type oxide layers 32a, p-type dopant is doped (co-addition of Ga and N, for example). The p-type dopant gas can be supplied at a constant flow volume while keeping the supply of the source gas for the $Mg_zZn_{1-z}O$-type oxide layers 32a uninterrupted. This allows formation of the $Mg_zZn_{1-z}O$-type oxide layers 32a as being uniformly doped with the p-type dopant.

Figure 8:
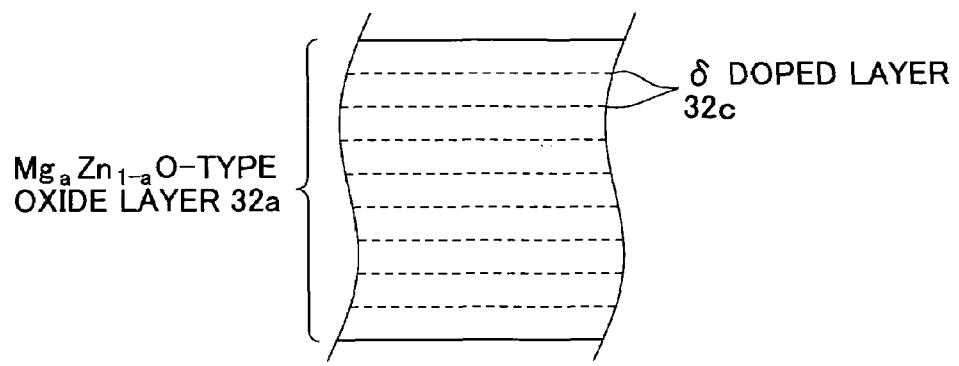
FIG. 8 is a schematic drawing of a structure of a $Mg_zZn_{1-z}$O-type oxide layer δ-doped with a p-type dopant.

On the other hand, as shown in FIG. 8, it is also allowable to form high-concentration doped layers (referred to as "δ-doped layers", hereinafter) 32c having a p-type dopant concentration larger than the average concentration of the p-type MgZnO cladding layer 32 (or $Mg_zZn_{1-z}O$-type oxide layers 32a), so as to have a zonal width not larger than a single-molecular layer of the $Mg_zZn_{1-z}O$-type oxide layers 32a (the light-emitting device of the second aspect of this invention). This configuration is successful in further actualizing the effect of reducing the background electron concentration and therefore in reducing the average p-type dopant concentration of the p-type MgZnO cladding layer 32 as a whole, so that the emission efficiency can further be improved. The δ-doped layer 32c can further improve the electron compensating effect when periodically formed in the number of layers of two or more.

The amount of supply of the p-type dopant in the δ-doped layer 32c is preferably adjusted so that the ratio of coverage by the p-type dopant gas falls within a range from 1/20 to 1/4 molecular layers. The coverage ratio of less than 1/20 molecular layers results in only an insufficient effect of reducing the background electron concentration. On the other hand, the coverage ratio exceeding 1/4 molecular layers tends to result in an excessive amount of addition of the p-type dopant, and consequently in a lowered emission efficiency. The distance of formation of the δ-doped layer 32c is preferably adjusted within a range from 10 to 500 molecular layers on the basis of the molecular layers of MgZnO layer 32a. The distance less than 10 molecular layers tends to result in an excessive amount of addition of the p-type dopant, and consequently in a lowered emission efficiency. On the other hand, the distance exceeding 500 molecular layers may result in only an insufficient effect of reducing the background electron concentration, or an insufficient attainment of the p-type conductivity.

Figure 9:
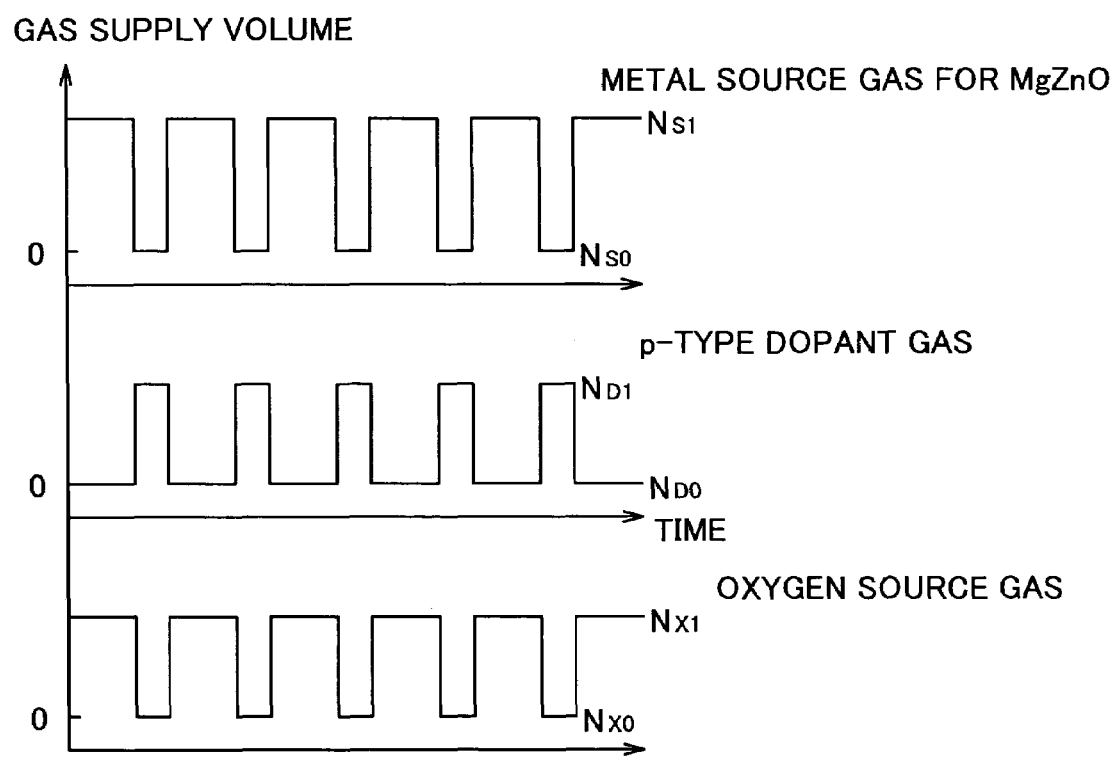
FIG. 9 is a schematic drawing of an exemplary gas supply sequence during formation of the $Mg_zZn_{1-z}O$-type oxide layer shown in FIG. 8 by the MOVPE process.

The δ-doped layer 32c can be formed by temporarily increasing the ratio of supply concentration of the p-type dopant gas to that of the source gas for $Mg_zZn_{1-z}O$-type oxide (metal source gas+oxygen source gas). Formation of a plurality of δ-doped layers 32c in a discrete manner in the thickness-wise direction is available by intermittently increasing the ratio of supply concentration of the p-type dopant gas. FIG. 9 shows an exemplary gas supply sequence for the case, in which the supply volume of the metal source gas for MgZnO is changed so that a large-flow-volume period having a supply volume of $N_{S1}$ and a small-flow-volume period having a supply volume of $N_{S0}$, smaller than $N_{S1}$, appear in an alternate manner; the supply volume of the oxygen source gas is changed so that a large-flow-volume period having a supply volume of $N_{X1}$ and a small-flow-volume period having a supply volume of $N_{X0}$, smaller than $N_{X1}$, appear in an alternate manner; and the p-type dopant gas is changed so that a small-flow-volume period (flow volume: $N_{D0}$) corresponded to the large-flow-volume period of the source gas for MgZnO and a large-flow-volume period (flow volume: $N_{D1}$) corresponded to the small-flow-volume period of the same appear in an alternate manner.

The effect of reducing the background electron concentration through the formation of the δ-doped layer 32c increases as changes in the p-type dopant concentration profile become sharper. To obtain this sort of profile, it is effective to interrupt the supply of the source gas for $Mg_zZn_{1-z}O$ during the formation of the δ-doped layer 32c. This specifically means that both of $N_{S0}$ and $N_{X0}$ in FIG. 9 are fallen to zero. It is preferable that also the flow volume $N_{D0}$ of the p-type dopant gas is fallen to zero during the non-formation period of the δ-doped layer 32c in view of making more sharp changes in the concentration profile. When the δ-doped layer 32c is formed in the $Mg_zZn_{1-z}O$-type oxide layer 32a, it is still also preferable to change the growth mode of the $Mg_zZn_{1-z}O$-type oxide layer 32a based on the MOVPE process into the ALE mode, which is the same mode during the growth of the buffer layer 11, immediately before the supply of the p-type dopant gas. More specifically, at least the last one molecular layer of the $Mg_zZn_{1-z}O$-type oxide layer 32a immediately before the supply of the p-type dopant gas is formed by ALE so as to expect the self-termination, and then the p-type dopant gas is supplied. This is successful in obtaining an extremely sharp profile of the concentration change.

Figure 10:
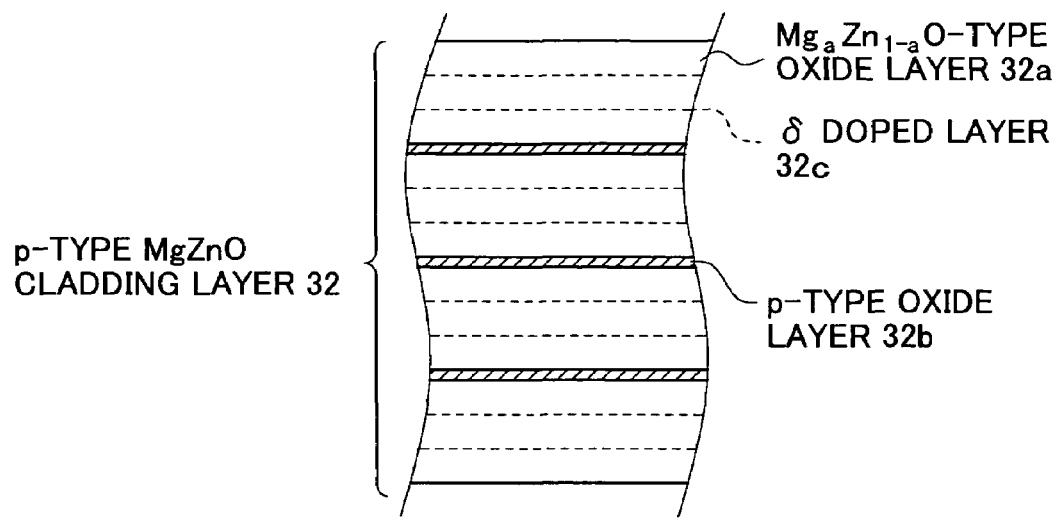
FIG. 10 is a schematic drawing of a structure of a p-type MgZnO cladding layer in which δ-doped layers and p-type oxide layers are formed in a doubled periodicity.

FIG. 10 schematically shows a detailed structure of the p-type MgZnO cladding layer 32 finally obtained by the method described in the above. This is, so to speak, a double periodical structure in which a plurality of δ-doped layers 32c are periodically formed in one $Mg_zZn_{1-z}O$-type oxide layer 32a, and the p-type oxide layers 32b are further periodically formed with respect the $Mg_zZn_{1-z}O$-type oxide layers 32a. This is successful in bringing out the best effect of reducing the background electron concentration, in exactly giving the p-type conductivity to the p-type MgZnO cladding layer 32, and in improving the emission efficiency, and as a consequence, the luminance of the light-emitting device as compared with those attained by the configuration shown in FIG. 1.

Figure 11:
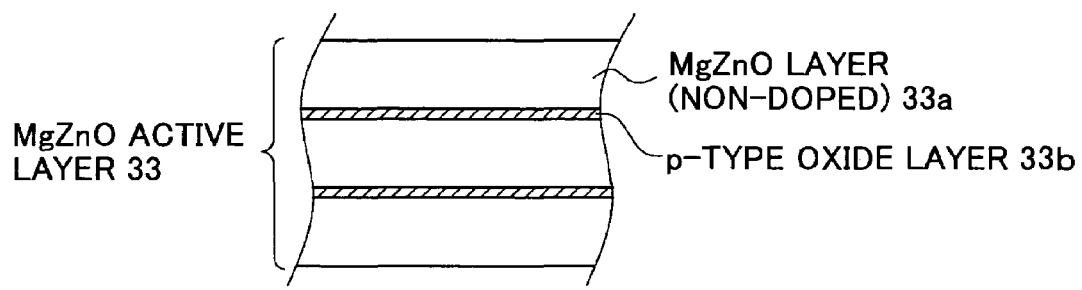
FIG. 11 is a schematic drawing of an exemplary p-type MgZnO active layer in which the p-type oxide layers are periodically formed.

As shown in FIG. 11, also p-type oxide layers 33b can be formed in an MgZnO active layer 33 in an absolutely similar manner, and this is contributable to reduction in the background electron concentration, and further to improvement in the emission efficiency. In this case, the entire portion of the MgZnO active layer 33 necessarily has a conduction property of intrinsic semiconductor type (i-type), and $Mg_zZn_{1-z}O$-type oxide layers 33a are configured as non-doped layers.

During the growth of the MgZnO active layer 33 and p-type MgZnO cladding layer 32, it is effective to keep the pressure inside the reaction chamber at 10 Torr or above in order to suppress generation of the oxygen deficiency. This is successful in further suppressing elimination of oxygen, and in growing the MgZnO layer having only a less amount of oxygen deficiency. In particular for the case where $N_2O$ is used as the oxygen component source, the above-described setting of the pressure can prevent $N_2O$ from being rapidly dissociated, and can suppress the generation of the oxygen deficiency in a more effective manner. The higher the atmospheric pressure rises, the larger the suppressive effect against the oxygen elimination becomes, where a sufficiently distinctive effect can be obtained under the pressure only as high as 760 Torr ($1.01 \times 10^5$ Pa, or 1 atm). In an exemplary case under 760 Torr or lower, it is advantageous that only a relatively simple structure of a sealing for the reaction chamber will suffice since the reaction chamber is kept at normal pressure or reduced pressure. On the other hand, adoption of the pressure exceeding 760 Torr means pressurizing of the internal of the chamber, and requires some tighter sealing so as to prevent the internal gas from leaking, and adoption of a considerably high pressure necessitates a pressure-proof structure, where more distinct effect of suppressing the oxygen elimination can be obtained. The upper limit of the pressure in this case should be determined at an appropriate value so as to keep a reasonable balance between cost for the apparatus and attainable suppressive effect against the oxygen elimination (e.g., 7,600 Torr ($1.01 \times 10^6$ Pa or 10 atm) or around).

After completion of the growth of the light-emitting layer portion, the active layer 33 and the p-type MgZnO cladding layer 32 are partially removed typically by photolithography as shown in FIG. 5, a transparent electrode 125 composed of indium-tin oxide (ITO) or the like is formed, and a metal electrode 122 is formed on the remained portion of the p-type MgZnO cladding layer 32, which is followed by dicing them together with the substrate 10 to obtain the light-emitting device 1. It is obvious that the light-emitting device 1 is configured as having the buffer layer 11 composed of MgZnO and formed on the substrate 10, and as having the light-emitting layer portion composed of MgZnO formed further thereon. The light can be extracted mainly from the transparent sapphire substrate 10 side.

Although the individual layers described in the aforementioned method of fabrication are grown by the MOVPE process, it is also allowable to adopt the MBE process. In an exemplary case where an LiO layer is formed as the p-type oxide layer, or Li is used as the p-type dopant, it is also allowable to use a solid Li as a source material or a dopant source for forming the p-type oxide.

(Embodiment 2)

Figure 12A:
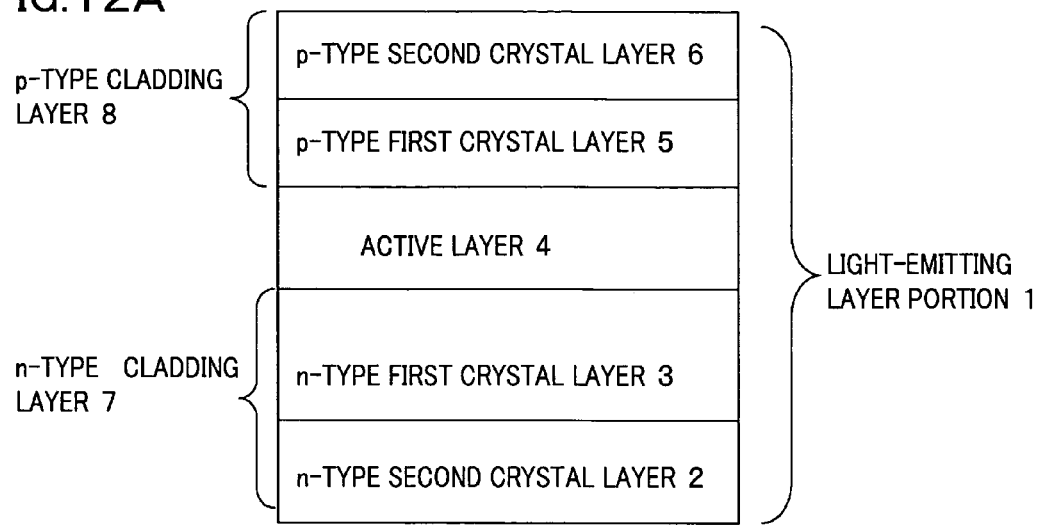
FIG. 12A is a sectional view of a stacked structure conceptually showing a light-emitting device according to a second embodiment of this invention.
Figure 12B:
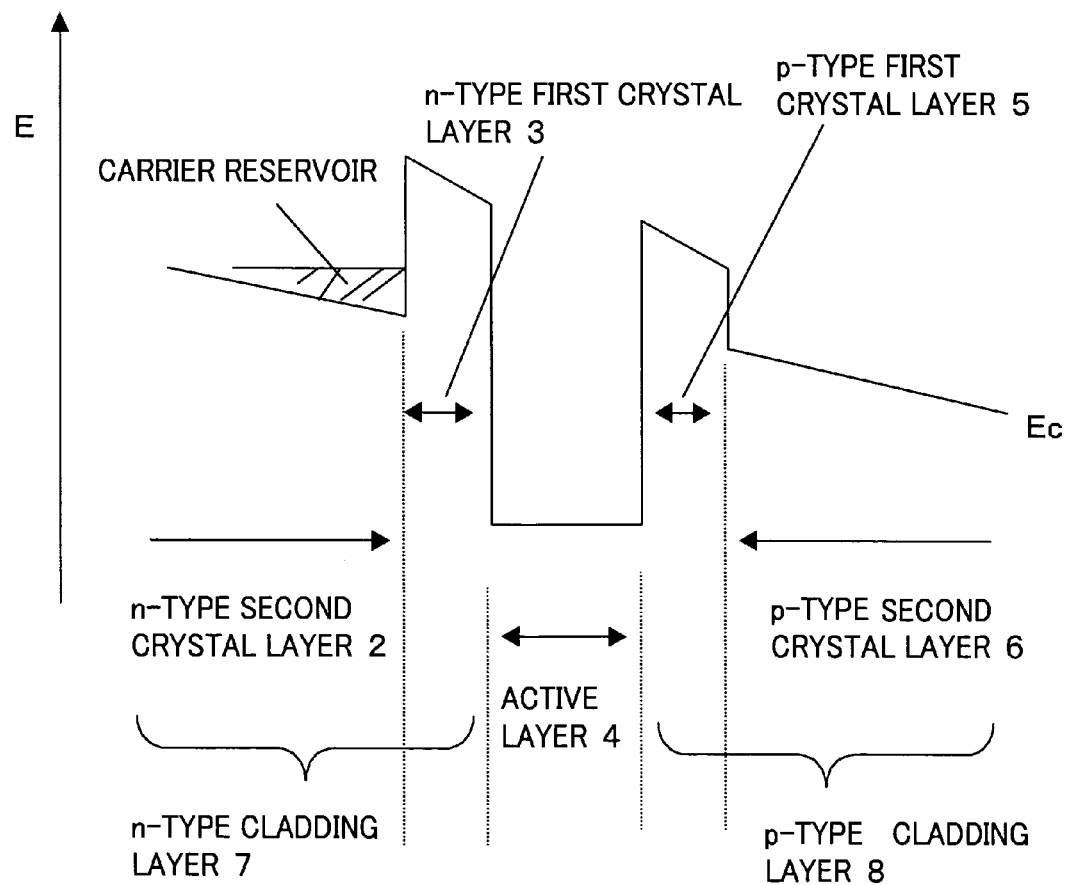
FIG. 12B is a schematic drawing of an energy level (Ec) of the bottom of the conduction band in the stacked structure shown in FIG. 12A.

FIG. 12A schematically shows a stacked structure of an essential portion of a light-emitting device according to the second embodiment of this invention (a light-emitting device of the third aspect of the invention). The light-emitting layer portion 1 having a double hetero-structure is formed by sequentially stacking an n-type second crystal layer 2, an n-type first crystal layer 3, an active layer 4, a p-type first crystal layer 5, and a p-type second crystal layer 6, each of which being composed of a wide-gap-type oxide semiconductor, in this order in lattice-matched manner. The n-type second crystal layer 2 and the n-type first crystal layer 3 compose the n-type cladding layer 7, and the p-type first crystal layer 5 and the p-type second crystal layer 6 compose the p-type cladding layer 8. The n-type first crystal layer 3 and the p-type first crystal layer 5 are composed of a wide-gap-type oxide semiconductor having a band gap energy larger than that of the n-type second crystal layer 2 and the p-type second crystal layer 6, respectively. FIG. 12B schematically shows an energy level (Ec) of the bottom of the conduction band of the stacked structure shown in FIG. 12A under voltage application. The n-type first crystal layer 3 functions as a potential barrier against carriers generated in the n-type second crystal layer 2, and the carriers are temporarily reserved in a region (hatched region in FIG. 12B: carrier reservoir region) in the vicinity of the interface between the n-type first crystal layer 3 and the n-type second crystal layer 2, and thereby the carrier concentration is raised. Although FIG. 12B shows only the energy level of the bottom of the conduction band, also at the upper end of the valence band, the carriers generated in the p-type second crystal layer 6 are dammed by the potential barrier formed by the p-type first crystal layer 5, and raises the concentration thereof in the vicinity of the stacking interface between the p-type first crystal layer 5 and the p-type second crystal layer 6. Even if the cladding layer is composed of a crystal attainable only a low carrier density, the stacked structure shown in FIG. 12A is successful in raising the carrier density therein in the vicinity of the active layer, and consequently in raising the emission efficiency at the active layer.

Figure 13:
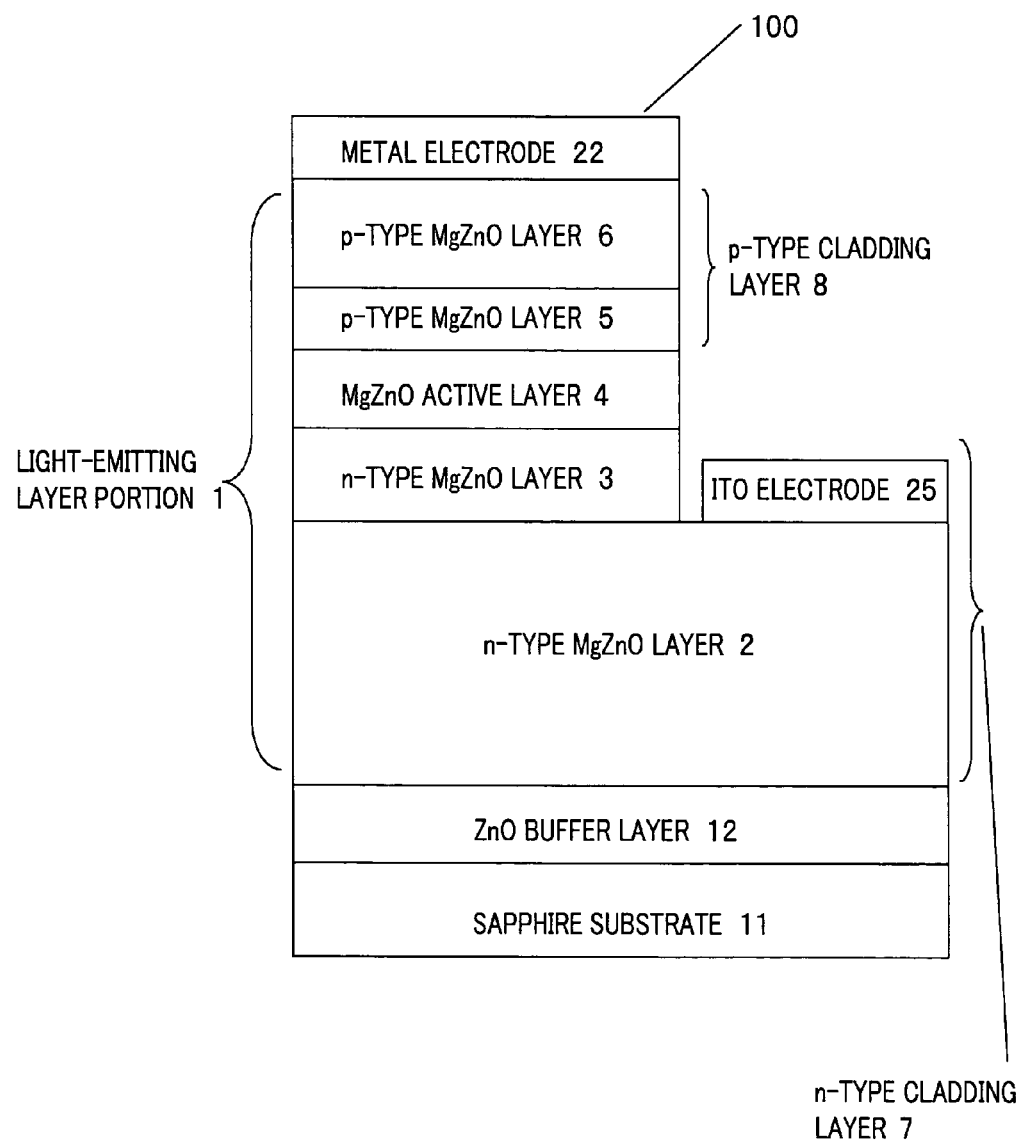
FIG. 13 is a sectional view of a stacked structure showing an exemplary light-emitting device of which light-emitting layer portion shown in FIG. 12A is composed of MgZnO.

FIG. 13 is a sectional view of a stacked structure showing an embodiment of the light-emitting device in which $Mg_xZn_{1-x}O$ ($0 \leq x \leq 1$) is adopted as the wide-gap-type oxide semiconductor. More specifically, a ZnO buffer layer 12 is epitaxially grown on a sapphire substrate 11, and the n-type $Mg_xZn_{1-x}O$ layer (n-type second crystal layer) 2, the n-type $Mg_xZn_{1-x}O$ layer (n-type first crystal layer) 3, the $Mg_xZn_{1-x}O$ active layer 4, the p-type $Mg_xZn_{1-x}O$ layer (p-type first crystal layer) 5, and the p-type $Mg_xZn_{1-x}O$ layer (p-type second crystal layer) 6 are then formed sequentially in this order. The epitaxial growth of the individual layers can be carried out by the aforementioned MOVPE process or the MBE process. Major source materials for forming the individual layers will not be explained because they are similar to those described in Embodiment 1.

$Mg_xZn_{1-x}O$ is an alloy of ZnO, which is an n-type semiconductor in its non-doped status, and MgO as an insulator, so that it exhibits more stronger ionic crystal property as the alloy composition x with respect to Zn increases. As a consequence, increase in the alloy composition x in the MgZnO crystal lowers the efficiency of carrier generation through doping. The band gap energy of the MgZnO crystal, however, increases as the alloy composition x increases, so that the cladding layer composed of MgZnO will have an improved carrier confinement effect and an improved emission efficiency as the alloy composition x increases. In order to make the cladding layer composed of MgZnO exhibit two functions, which are confinement effect for the carriers of the active layer and generation of effective carriers, the alloy compositions x of the n-type first crystal layer 3 and the p-type fist crystal layer 5 are adjusted so that the band gap energies of these layers become larger than those of the n-type second crystal layer 2 and the p-type second crystal layer 6, respectively. More specifically, the first crystal layers have the alloy compositions x larger than those of the second crystal layers.

In this configuration of the cladding layer which has a double-layered structure composed of at least the first crystal layer and the second crystal layer, and in which the first crystal layer in adjacent to the active layer is adjusted so as to have the alloy composition x larger than that of the second crystal layer, the first crystal layer can function as the potential barrier against the carriers generated in the second crystal layer. This results in two effects, not only raising the carrier density through temporary reserve of the carriers in the region in the vicinity of the interface between the first crystal layer and the second crystal layer, but also enhancing the effect of confining the carriers injected into the active layer.

Figure 14A:
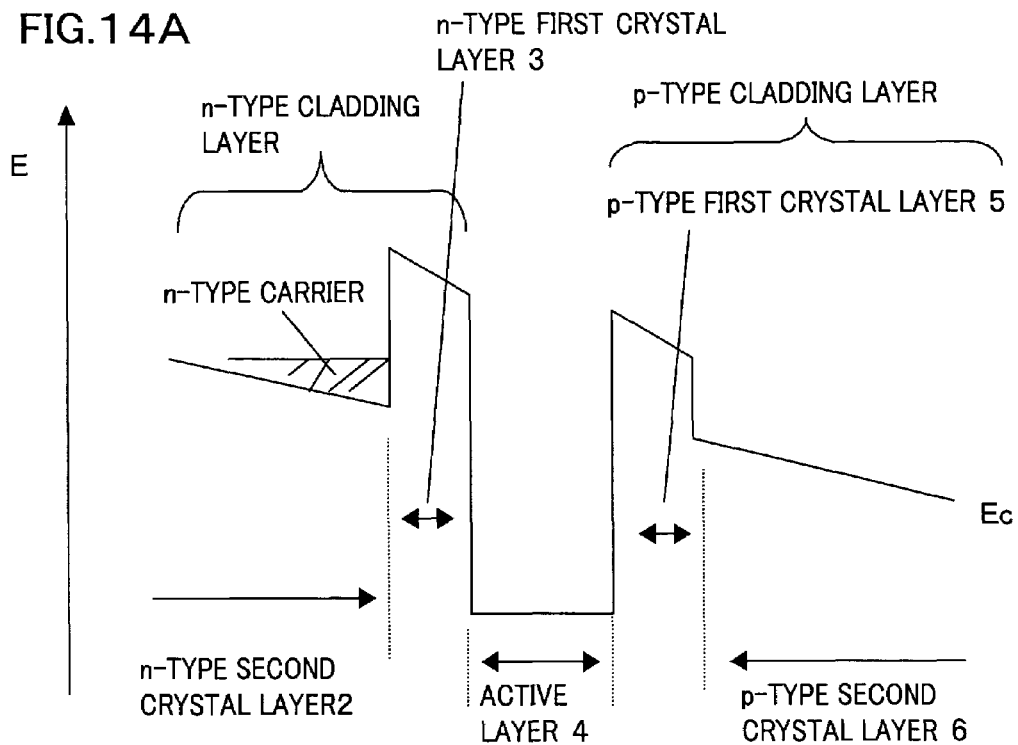
FIG. 14A is a schematic drawing of an energy level (Ec) of the bottom of the conduction band in the light-emitting layer portion shown in FIG. 13.
Figure 14B:
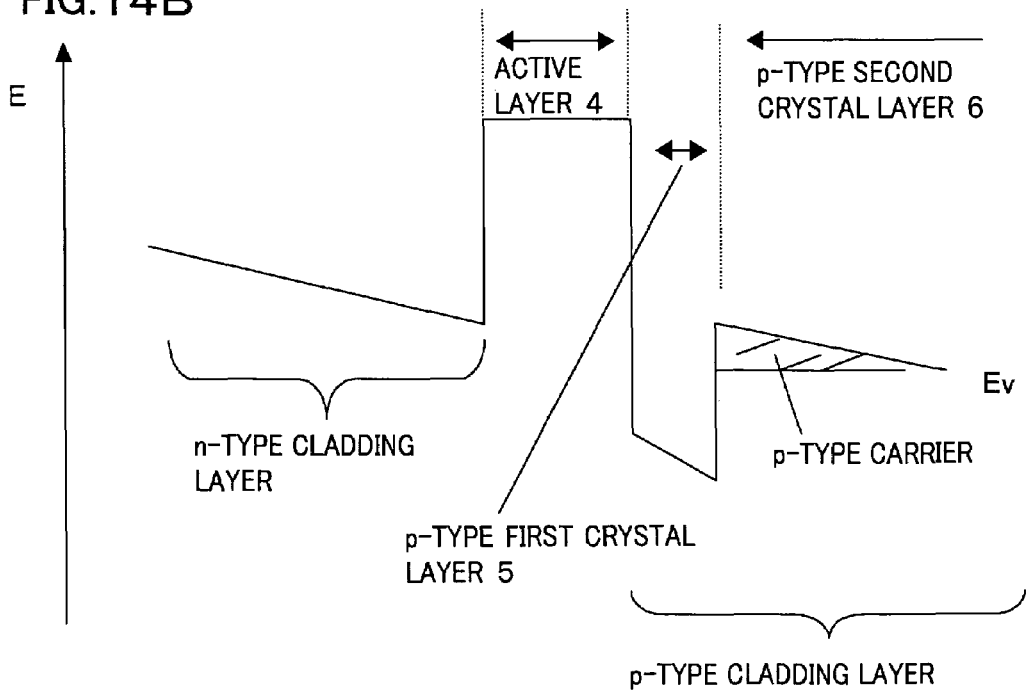
FIG. 14B is a schematic drawing of an energy level (Ev) of the upper end of the valence band in an example modified from FIG. 13.

FIG. 14A schematically shows an energy level (Ec) of the bottom of the conduction band of the stacked structure in the light-emitting layer portion shown in FIG. 13 under voltage application. N-type carriers (electrons) are reserved in a region in the vicinity of the interface between the n-type first crystal layer 3 and the n-type second crystal layer 2, assuming the region as the carrier reservoir, and thereby the n-type carrier concentration is raised. This consequently increases the density of the n-type carriers injected into the active layer 4. The same will apply also to the valence band, although only the conduction band is shown in FIG. 14A, where p-type carriers (holes) are reserved in a region in the vicinity of the interface between the p-type first crystal layer 5 and the p-type second crystal layer 6, assuming the region as the carrier reservoir, and thereby the density of the p-type carriers injected into the active layer 4 increases. It is to be noted that, as shown in FIG. 14B, it is also allowable to form the first crystal layer 5 only on the p-type-cladding-layer 8 side.

Figure 15A:
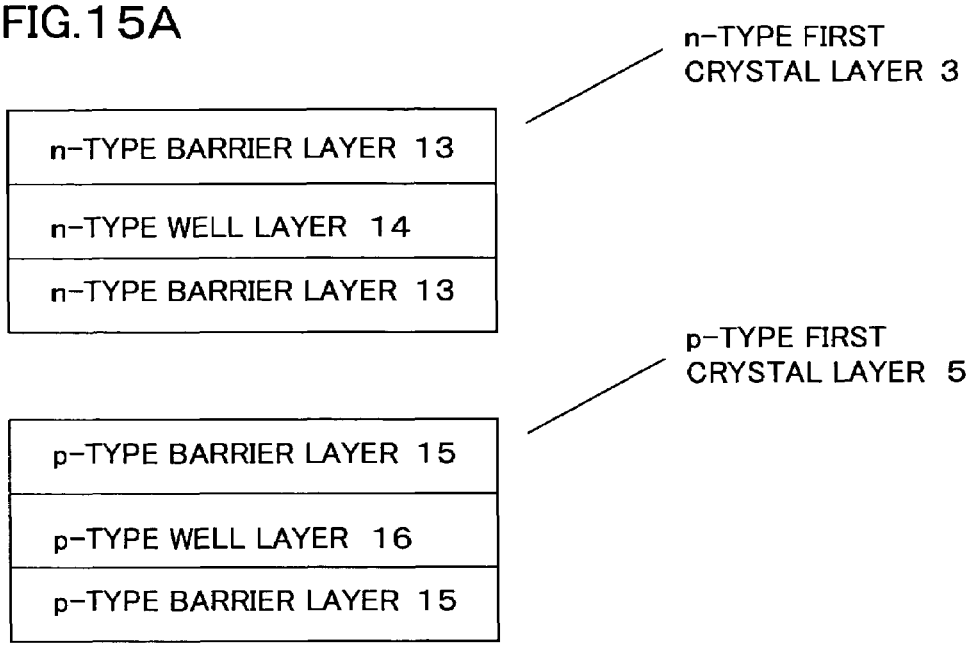
FIGS. 15A and 15B are schematic drawings of exemplary first crystal layers having quantum well structures.
Figure 15B:
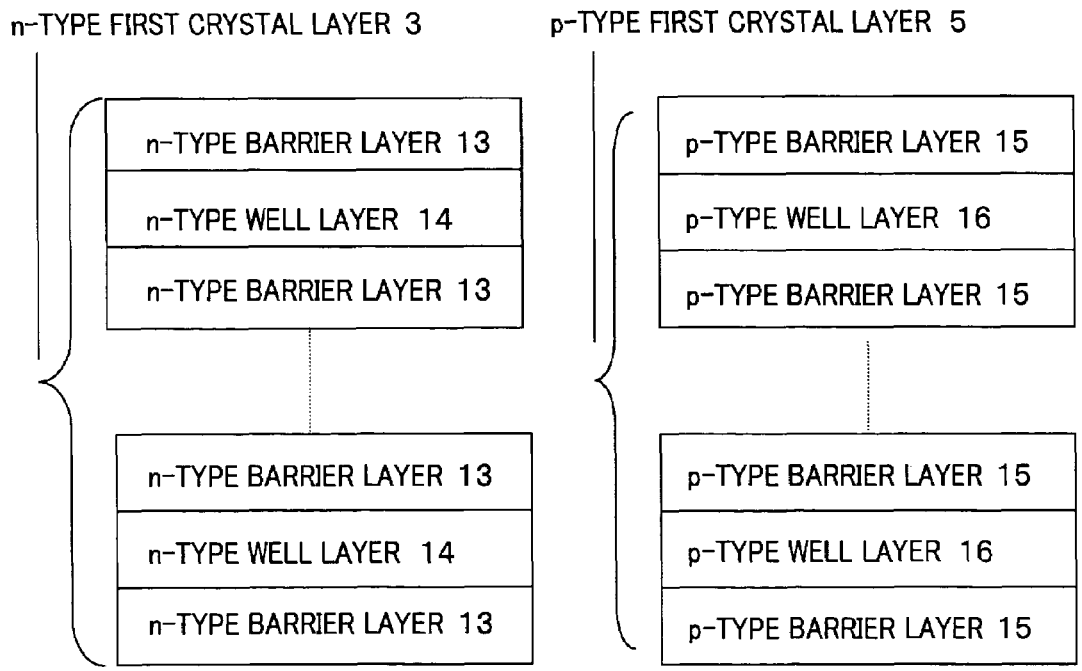
Figure 16A:
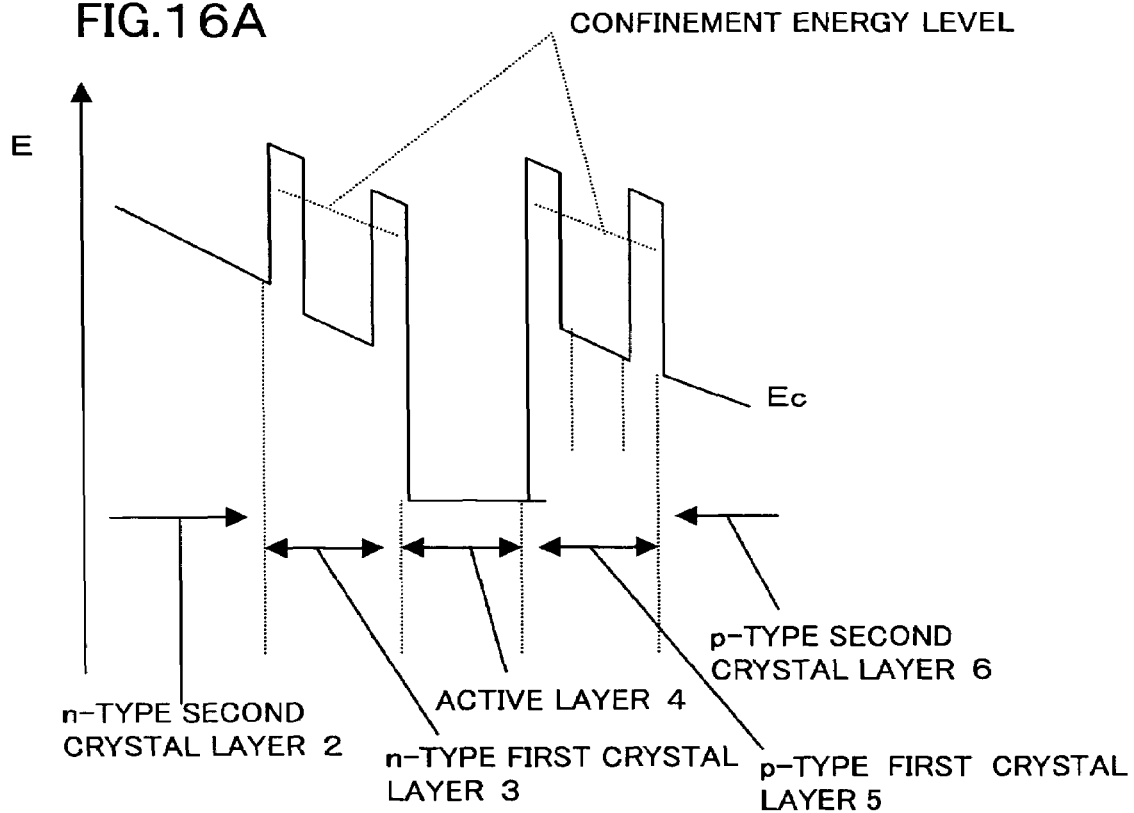
FIG. 16A is a schematic drawing of an energy level (Ec) of the bottom of the conduction band when the quantum well structure shown in FIG. 15A is adopted.
Figure 16B:
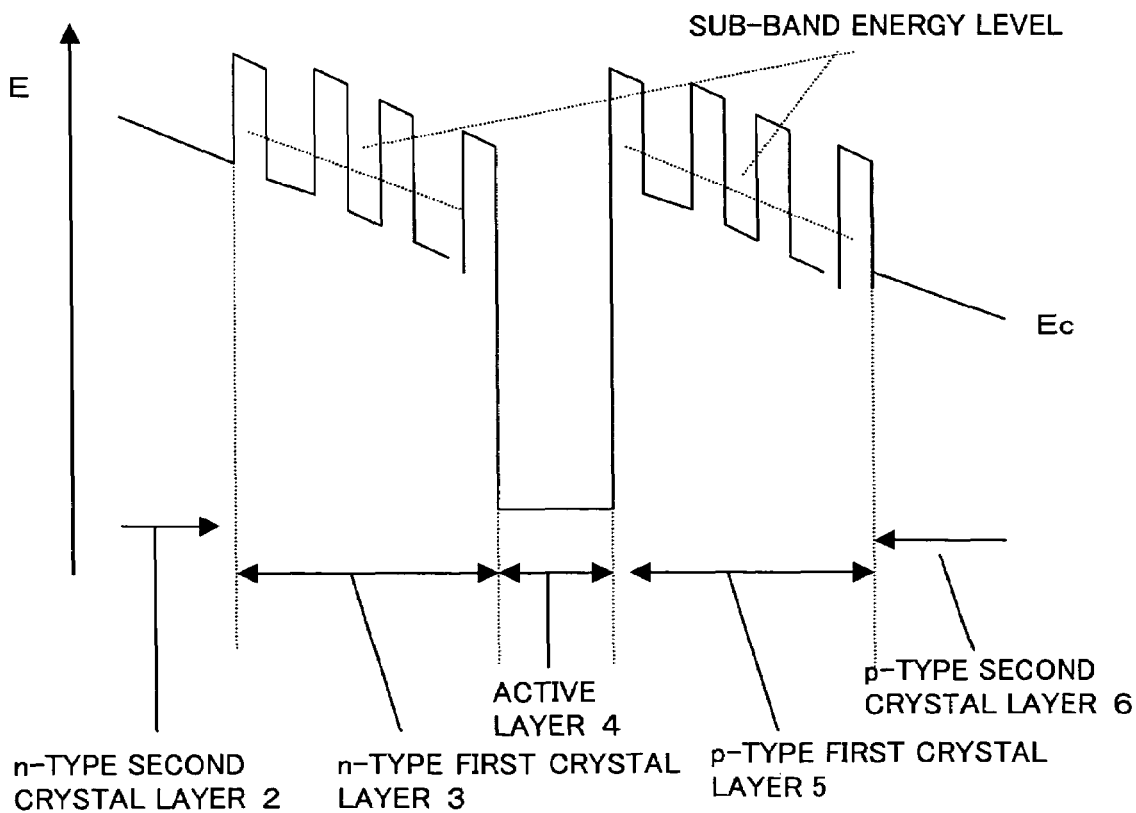
FIG. 16B is a schematic drawing of an energy level (Ec) of the bottom of the conduction band when the quantum well structure shown in FIG. 15B is adopted.

FIG. 15A shows an exemplary configuration of the n-type first crystal layer 3 and the p-type first crystal layer 5 configured as having a single quantum well structure, and FIG. 15B shows those configured as having a multiple quantum well structure. In the single quantum well structure, one well layer (n-type well layer 14 or p-type well layer 16) is sandwiched by two barrier layers (n-type barrier layers 13 or p-type barrier layers 15), whereas in the multiple quantum well structure, a plurality of well layers and barrier layers are stacked. FIGS. 16A and 16B schematically show energy levels (Ec) of the bottoms of the conduction bands of the stacked structures shown in FIGS. 15A and 15B under voltage application, where FIG. 16A corresponds to FIG. 15A, and FIG. 16B to FIG. 15B. As shown in FIG. 16A, for the case where the n-type first crystal layer 3 and the p-type first crystal layer 5 are configured as having the single quantum well structure, a confinement energy level (dotted line) is formed between Ec of the well layer and Ec of the barrier layer. This allows the carriers generated in the n-type second crystal layer 2 to be injected into the active layer 4 through these energy levels, and thereby energy loss due to scattering or the like can be suppressed. Whereas in the multiple quantum well structure shown in FIG. 16B, a sub-band energy level (dotted line) further lower than the aforementioned confinement energy level is formed, and this further enhances the effect. Although FIG. 16B shows the multiple quantum well structure in which the single quantum well structure is repeated in the number of periodicity of three for simplicity of the illustration, there is no limitation on the number of periodicity, and the number of two, or four or more is also allowable. However considering the mobility of the carriers within the multiple quantum well structure, it is appropriate to adjust the number of periodicity from 1 to 7. In the MgZnO crystal, it is also allowable to form the first crystal layer having the aforementioned quantum well structure only on the p-type-cladding-layer side.

The active layer 4 is composed of a material having an appropriate band gap energy depending on desired emission wavelength by adjusting the alloy composition. For example, for those available for visible light emission, materials having band gap energies $E_g$ (3.10 to 2.18 eV or around), capable of causing light emission in a wavelength range of 400 to 570 nm, are selected. Although this range covers emission wavelength from violet region to green region, those having band gap energies $E_g$ (2.76 to 2.48 eV or around) capable of causing light emission in a wavelength range of 450 to 500 nm are selected in particular for the case where blue light emission is desired. On the other hand, those having band gap energies $E_g$ (4.43 to 3.10 eV or around) capable of causing light emission in a wavelength range of 280 to 400 nm are selected in particular for the case where ultraviolet emission is desired.

After completion of the growth of the light-emitting layer portion 1, the n-type MgZnO layer 3 and the p-type MgZnO layer 6 are partially removed typically by photolithography as shown in FIG. 13, a transparent electrode 25 composed of indium-tin oxide (ITO) or the like is formed, and a metal electrode 22 is formed on the remained portion of the p-type MgZnO layer 6, which is followed by dicing them together with the substrate 11 to obtain the light-emitting device 100. The light can be extracted mainly from the transparent sapphire substrate 11 side.

As has been described in the above, formation of the light-emitting device 100 in which the light-emitting layer portion 1 is configured using $Mg_xZn_{1-x}O$ ($0 \leq x \leq 1$) is successful in raising the carrier density also in the cladding layer (particularly in the p-type cladding layer), which has conventionally been obtainable only with a low carrier density so as to retain a desirable crystal quality, locally in the vicinity of the active layer, and this makes it possible to efficiently extract short-wavelength emission.

Figure 17A:
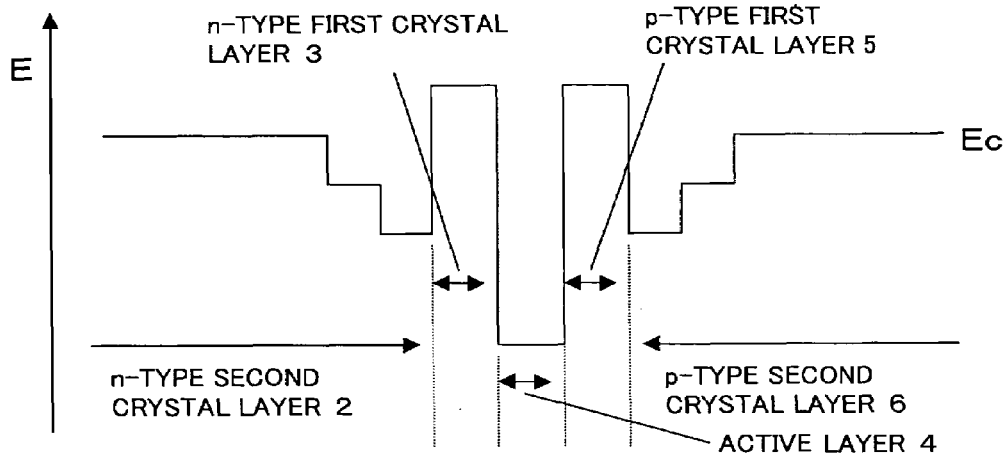
FIGS. 17A, 17B and 17C are schematic drawings showing various modified examples of the quantum well structure.
Figure 17B:
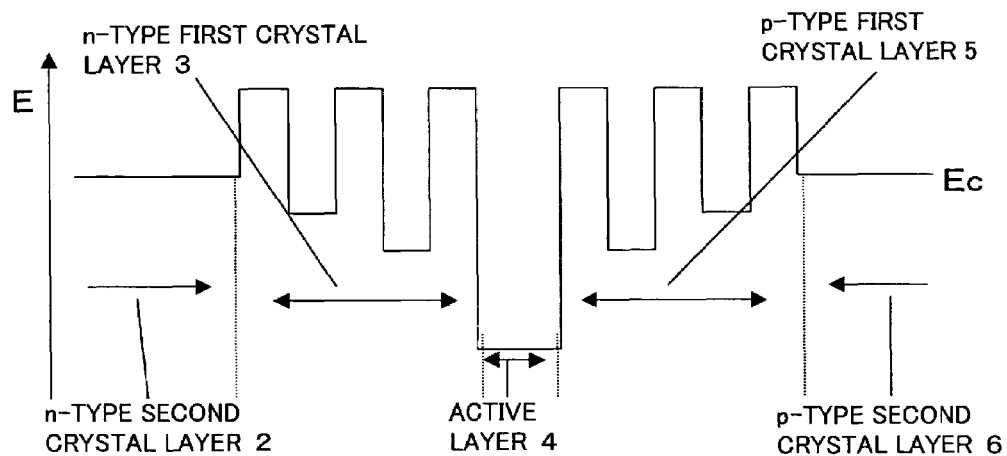
Figure 17C:
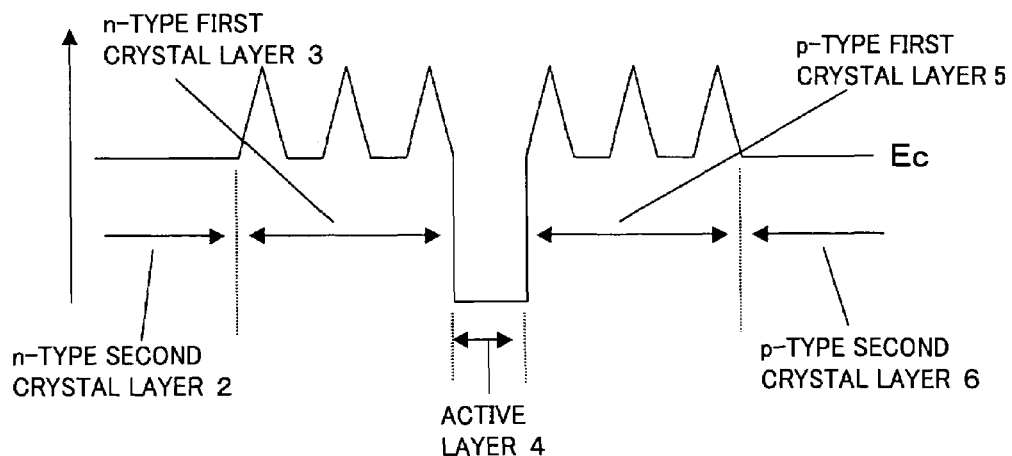

FIGS. 17A and 17B are band charts showing various modified examples of the formation style of the first crystal layer (showing energy levels of the bottoms of the conduction bands only). FIG. 17A shows an exemplary case in which the n-type second crystal layer 2 and the p-type second crystal layer 6 are formed such that a portion thereof more closer to the n-type first crystal layer 3 and the p-type fist crystal layer 5, respectively, will have a smaller band gap energy. This is successful in further enhancing the carrier reserving effect. FIG. 17B shows an exemplary case in which the n-type first crystal layer 3 and the p-type first crystal layer 5 are configured as having a multiple quantum well structure, where the individual well layers are formed such that a well layer more closer to the active layer 4 will have a smaller band gap energy. In this type of multiple quantum well structure, band energies formed by sub-bands will be lower in a sub-band closer to the active layer 4. This is successful in further reducing the energy loss during injection of the carriers through the sub-bands into the active layer 4, and therefore in raising the emission efficiency at the active layer 4. FIG. 17C again shows a multiple quantum well structure, where the alloy composition x of the barrier layer is continuously (or step-wisely) varied so as to increase from the both ends towards the center of the layer, to thereby add a slope to the potential barrier. This further promotes formation of the sub-bands, and is successful in raising density of the carriers injected into the active layer 4.

The effect of this invention can of course be attained also by stacking the p-type cladding layer, the active layer and the n-type cladding layer in this order as viewed from the substrate, rather than stacking the n-type cladding layer, the active layer and the p-type cladding layer in this order as viewed from the substrate.

What is claimed is:

1. A light-emitting device comprising a light-emitting layer portion based on a double hetero-structure, and having at least either of an active layer and a p-type cladding layer included in the double hetero-structure as being configured as an MgZnO layer which is mainly composed of $Mg_aZn_{1-a}$O-type oxide (where, $0 \leq a \leq 1$), wherein the MgZnO layer has, interposed therein, a p-type oxide layer which is different from the $Mg_aZn_{1-a}$O-type oxide and has a p-type conductivity;

wherein the p-type oxide layer has any one of CuO, NiO and LiO as a major constituent.

2. The light-emitting device as claimed in claim 1, wherein the p-type oxide layer is formed in a plural number so as to be discrete over the thickness-wise direction of the MgZnO layer.

3. The light-emitting device as claimed in claim 1, wherein the p-type oxide layer is formed to a thickness of not smaller than a single-molecular layer and not larger than 20 nm.

4. A light-emitting device comprising a light-emitting layer portion based on a double hetero-structure, and having a p-type cladding layer included in the double hetero-structure as being mainly composed an $Mg_aZn_{1-a}$O-type oxide (where, $0 \leq a \leq 1$), wherein the p-type cladding layer has, formed therein, a high-concentration doped layer having a p-type dopant concentration larger than the average concentration of the p-type cladding layer, and being formed so as to have a zonal width not larger than a single-molecular layer of the p-type cladding layer.

5. The light-emitting device as claimed in claim 4, wherein the high-concentration doped layer is disposed in a plural number so as to be discrete over the thickness-wise direction of the p-type cladding layer.

6. The light-emitting device as claimed in claim 4, wherein the high-concentration doped layer is co-added with Ga and N as the p-type dopants.

7. A light-emitting device comprising a light-emitting layer portion based on a double hetero-structure, and having a p-type cladding layer included in the double hetero-structure as being mainly composed of an $Mg_aZn_{1-a}$O-type oxide (where, $0 \leq a \leq 1$), wherein the p-type cladding layer has, formed therein a discrete manner in the thickness-wise direction, a high-concentration doped layer having a p-type dopant concentration larger than the average concentration of the p-type cladding layer and a p-type oxide layer which is different from the $Mg_aZn_{1-a}$O-type oxide and has a p-type conductivity, the high-concentration doped layer being formed so as to have a zonal width not larger than a single-molecular layer of the p-type cladding layer, and the p-type oxide layer being formed to a thickness of not smaller than a single-molecular layer and not larger than 20 nm.

8. A light-emitting device comprising a light-emitting layer portion which is composed of a wide-gap-type oxide semiconductor having a band gap energy of 2.2 eV or larger, the light-emitting layer portion having a double hetero-structure in which a p-type cladding layer, an active layer and an n-type cladding layer are stacked with each other, wherein at least either of the p-type cladding layer and the n-type cladding layer comprises:

a first crystal layer which is disposed in adjacent to the active layer so as to form a hetero junction, and functions as a barrier layer against carriers; and a second crystal layer which is disposed in adjacent to the first crystal layer, and on the side thereof opposite to the active layer, and has a band gap energy smaller than that of the first crystal layer.

9. The light-emitting device as claimed in claim 8, wherein a thickness t of the first crystal layer is adjusted within a range from 50 Å to 500 Å.

10. The light-emitting device as claimed in claim 8, wherein the cladding layer having the first crystal layer and the second crystal layer is the p-type cladding layer.

11. The light-emitting device as claimed in claim 8, wherein the first crystal layer has a quantum well structure in which barrier layers and well layers, differed from each other in the band gap energy, are alternately stacked.

12. The light-emitting device as claimed in claim 23, wherein a thickness $t_B$ of the barrier layer is adjusted within a range from 50 Å to 150 Å, and a thickness $t_W$ of the well layer is adjusted within a range from 15 Å to 150 Å.

13. The light-emitting device as claimed in claim 11, wherein the wide-gap-type oxide semiconductor is $Mg_xZn_{1-x}O$ ($0 \leq x \leq 1$).

14. The light-emitting device as claimed in claim 13, wherein the first crystal layer has the quantum well structure, and satisfies a relation of $x_B > x_W$, where $x_B$ is the alloy composition x of the barrier layer composed of $Mg_xZn_{1-x}O$ ($0 < x \leq 1$), and $x_W$ is the alloy composition x of the well layer.

15. The light-emitting device as claimed in claim 14, wherein the alloy compositions $x_B$ and $x_W$ are adjusted within ranges from $0.10 \leq x_B \leq 0.65$ and $0.01 \leq x_W \leq 0.40$, respectively.

16. The light-emitting device as claimed in claim 14, wherein the barrier layer has a carrier concentration smaller than that of the well layer.

17. The light-emitting device as claimed in claim 8, wherein the wide-gap-type oxide semiconductor is $Mg_xZn_{1-x}O$ ($0 \leq x \leq 1$).

18. The light-emitting device as claimed in claim 17, wherein the first crystal layer comprises a single layer of $Mg_xZn_{1-x}O$ ($0 \leq x \leq 1$, where x is referred to as alloy composition, hereinafter), and satisfies a relation of $x_H > x_L$, where $x_H$ is the alloy composition x of the first crystal layer, and $x_L$ is the alloy composition x of the second crystal layer.

19. The light-emitting device as claimed in claim 18, wherein the alloy compositions $x_H$ and $x_L$ are adjusted within ranges from $0.10 \leq x_H \leq 0.65$ and $0.01 \leq x_L \leq 0.40$, respectively.

20. The light-emitting device as claimed in claim 18, wherein the first crystal layer has a carrier concentration smaller than that of the second crystal layer.

21. The light-emitting device as claimed in claim 17, wherein the p-type cladding layer composed of $Mg_xZn_{1-x}O$ ($0 < x \leq 1$) contains, as the p-type dopant, any one element, or two or more elements selected from Li, Na, Cu, N, P, As, Al, Ga and In.

22. The light-emitting device as claimed in claim 21, wherein the p-type dopant contains N, and any one element, or two or more elements selected from Ga, Al and In.

23. The light-emitting device as claimed in claim 17, wherein the n-type cladding layer composed of $Mg_xZn_{1-x}O$ ($0 < x \leq 1$) contains, as the n-type dopant, any one element, or two or more elements selected from B, Al, Ga and In.

* * * * *